US011428442B2

United States Patent
Sakuma et al.

(10) Patent No.: US 11,428,442 B2
(45) Date of Patent: Aug. 30, 2022

(54) COOLING DEVICE, CONTROL METHOD, AND STORAGE MEDIUM RELATED TO A PLURALITY OF EVAPORATORS AND A PLURALITY OF EVAPORATOR CONDENSERS

(71) Applicant: NEC Corporation, Tokyo (JP)

(72) Inventors: Hisato Sakuma, Tokyo (JP); Koichi Todoroki, Tokyo (JP); Masaki Chiba, Tokyo (JP); Takafumi Natsumeda, Tokyo (JP); Minoru Yoshikawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 71 days.

(21) Appl. No.: 16/975,918

(22) PCT Filed: Mar. 19, 2019

(86) PCT No.: PCT/JP2019/011564
§ 371 (c)(1),
(2) Date: Aug. 26, 2020

(87) PCT Pub. No.: WO2019/181972
PCT Pub. Date: Sep. 26, 2019

(65) Prior Publication Data
US 2020/0400348 A1     Dec. 24, 2020

(30) Foreign Application Priority Data
Mar. 23, 2018    (JP) .............................. JP2018-055825

(51) Int. Cl.
*F25B 5/02*    (2006.01)
*F25B 6/02*    (2006.01)
(Continued)

(52) U.S. Cl.
CPC .................. *F25B 5/02* (2013.01); *F25B 6/02* (2013.01); *F25B 25/005* (2013.01);
(Continued)

(58) Field of Classification Search
CPC ...... F25B 2600/2511; F25B 2600/2515; F25B 2313/0233; F25B 2313/02331;
(Continued)

(56) References Cited

U.S. PATENT DOCUMENTS

2013/0061620 A1* 3/2013 Li ............................. F25B 5/02
62/126

FOREIGN PATENT DOCUMENTS

JP    H02-126054 A    5/1990
JP    H07-062539 B2   7/1995
(Continued)

OTHER PUBLICATIONS

International Search Report for PCT Application No. PCT/JP2019/011564, dated May 7, 2019.
(Continued)

*Primary Examiner* — Jerry-Daryl Fletcher
*Assistant Examiner* — Daniel C Comings
(74) *Attorney, Agent, or Firm* — Sughrue Mion, PLLC

(57) ABSTRACT

A cooling device includes a first evaporation unit, a second evaporation unit, a first condensation unit, a second condensation unit, common piping, a compressor, an expansion valve, a first valve, and a second valve. The common piping combines liquid-phase refrigerant flowing from the first condensation unit and liquid-phase refrigerant flowing from the second condensation unit. The first valve adjusts the liquid-phase refrigerant amount flowing into the first evaporation unit. The second valve adjusts the liquid-phase refrigerant amount flowing into the second evaporation unit. In addition, the pressure inside the common pipe is greater than
(Continued)

the respective pressures inside the first evaporation unit and the second evaporation unit.

14 Claims, 5 Drawing Sheets

(51) Int. Cl.
    *F25B 25/00*     (2006.01)
    *F25B 49/02*     (2006.01)
    *H05K 7/20*     (2006.01)

(52) U.S. Cl.
    CPC ....... *F25B 49/022* (2013.01); *H05K 7/20309* (2013.01); *H05K 7/20318* (2013.01); *H05K 7/20327* (2013.01); *H05K 7/20354* (2013.01); *H05K 7/20827* (2013.01); *H05K 7/20836* (2013.01); *F25B 2600/2513* (2013.01)

(58) Field of Classification Search
    CPC ... F25B 2313/0253; F25B 2313/02531; H05K 7/20309; H05K 7/20318; H05K 7/20327; H05K 7/20354; H05K 7/20827
    See application file for complete search history.

(56) References Cited

FOREIGN PATENT DOCUMENTS

| | | |
|---|---|---|
| JP | H07-117254 B2 | 12/1995 |
| JP | H08-020139 B2 | 3/1996 |
| JP | 2010-190553 A | 9/2010 |
| JP | 5921931 B2 | 5/2016 |
| JP | 2016-200361 A | 12/2016 |

OTHER PUBLICATIONS

English translation of Written opinion for PCT Application No. PCT/JP2019/011564, dated May 7, 2019.

* cited by examiner

COOLING DEVICE, CONTROL METHOD, AND STORAGE MEDIUM RELATED TO A PLURALITY OF EVAPORATORS AND A PLURALITY OF EVAPORATOR CONDENSERS

This application is a National Stage Entry of PCT/JP2019/011564 filed on Mar. 19, 2019, which claims priority from Japanese Patent Application 2018-055825 filed on Mar. 23, 2018, the contents of all of which are incorporated herein by reference, in their entirety.

TECHNICAL FIELD

The present invention relates to a cooling device and the like and, for example, relates to a technology for a cooling device cooling a heat-generating body, and the like.

BACKGROUND ART

In recent years, with technological development of cloud services and the like, an amount of information processing is increasing. Amounts of computation in heat-generating bodies such as a central processing unit (CPU) and a multi-chip module (MCM) have a tendency to increase in order to process the enormous amount of information. Accordingly, heating values of the heat-generating bodies also have a tendency to increase. Further, cooling of heat-generating bodies by taking in the outside air is restricted in order to suppress mixing of dirt and dust from the outside air, not only in summertime, when the outside air temperature is high and air cooling is required, but also in wintertime, when the outside air temperature is low. Consequently, attempts to cool heat-generating bodies with a high degree of efficiency have been made throughout the year regardless of the outside air temperature.

A cooling device cooling a heat-generating body by making a combined use of a free-cooling refrigeration cycle and a compression refrigeration cycle is known as such a cooling technology (such as PTL 1).

In a free-cooling refrigeration cycle described in PTL 1, heat of information processing equipment (a heat-generating body) is cooled by circulating a coolant between a cooling coil (evaporation unit) and a condensation unit. Specifically, first, by evaporating a liquid-phase coolant after receiving heat of the information processing equipment, the cooling coil causes the liquid-phase coolant to undergo a phase change and generates a gas-phase coolant while recovering the heat of the information processing equipment. The gas-phase coolant flows into the condensation unit through a coolant gas pipe (vapor pipe). The condensation unit causes the gas-phase coolant to undergo a phase change and generates a liquid-phase coolant, by heat exchange using a temperature difference from the outside air. The liquid-phase coolant flows into the cooling coil through a coolant liquid pipe (liquid pipe). A forced circulation pump and a natural circulation valve are provided in parallel with the coolant liquid pipe. A differential manometer measures a specific gravity difference between a gas-phase coolant passing through the coolant gas pipe and a liquid-phase coolant passing through the coolant liquid pipe. When a measured value indicated by the differential manometer is equal to or less than a threshold value, the pressure controller starts the forced circulation pump and closes the natural circulation valve.

In a compression refrigeration cycle described in PTL 1, heat of information processing equipment (a heat-generating body) is cooled by circulating a coolant between the cooling coil (evaporation unit) and the condensation unit through a compressor and an expansion valve. Specifically, first, by evaporating a liquid-phase coolant after receiving heat of the information processing equipment, the cooling coil causes the liquid-phase coolant to undergo a phase change and generates a gas-phase coolant while recovering heat of the information processing equipment. The gas-phase coolant flows into the condensation unit after passing through a coolant gas pipe (vapor pipe) and undergoing temperature raise by being compressed by the compressor. The condensation unit causes the gas-phase coolant to undergo a phase change and generates a liquid-phase coolant, by heat exchange using a temperature difference from the outside air. The liquid-phase coolant flows into the cooling coil after passing through a coolant liquid pipe (liquid pipe) and undergoing pressure reduction by the expansion valve.

The technology described in PTL 1 activates the compression refrigeration cycle when heat of the information processing equipment cannot be sufficiently cooled by the free-cooling refrigeration cycle.

Technologies related to the present invention are also disclosed in PTLs 2 and 3.

CITATION LIST

Patent Literature

Patent Literature 1: Japanese Patent No. 5921931
Patent Literature 2: Japanese Unexamined Patent Application Publication No. H2-126054
Patent Literature 3: Japanese Unexamined Patent Application Publication No. 2010-190553

SUMMARY OF INVENTION

Technical Problem

However, the technology described in PTL 1 has a problem that a vapor pipe and a liquid pipe needs to be provided for each of the free-cooling refrigeration cycle and the compression refrigeration cycle, thus causing a longer piping length.

In local air conditioning at a data center or the like in particular, evaporation units are installed at plurality of locations inside a large server room, whereas compressors and condensation units tend to be installed at location distant from the evaporation units, such as along a wall or on another floor. Consequently, there is a problem that lengths of vapor pipes and liquid pipes in local air conditioning at a data center or the like become longer compared with common air conditioning, and therefore piping lengths of vapor pipes and liquid pipes become remarkably longer when PTL 1 is applied, thus causing increase in a piping cost and a pipe installation cost.

The present invention has been made in view of such circumstances, and an object of the present invention is to provide a cooling device and the like capable of shortening a piping length.

Solution to Problem

A cooling device according to the present invention includes: a first evaporation unit and a second evaporation unit each of which receiving heat of a heat-generating body, evaporating an internally stored liquid-phase coolant by heat of the heat-generating body, and causing a gas-phase coolant to flow out; a first condensation unit being connected to the first evaporation unit, condensing a gas-phase coolant flowing out from the first evaporation unit, and causing a liquid-phase coolant to flow out; a second condensation unit being connected to the second evaporation unit, condensing a gas-phase coolant flowing out from the second evaporation unit, and causing a liquid-phase coolant to flow out; a common pipe being provided between the first evaporation unit and the first condensation unit and also between the second evaporation unit and the second condensation unit and causing a liquid-phase coolant flowing out from the first condensation unit and a liquid-phase coolant flowing out from the second condensation unit to join; a compressor being connected to the second evaporation unit and the second condensation unit and compressing a gas-phase coolant flowing out from the second evaporation unit: an expansion valve being connected to the second condensation unit and the common pipe and expanding a liquid-phase coolant flowing out from the second condensation unit; a first valve being connected to the first evaporation unit and the common pipe and adjusting an amount of liquid-phase coolant flowing into the first evaporation unit; and a second valve being connected to the second evaporation unit and the common pipe and adjusting an amount of liquid-phase coolant flowing into the second evaporation unit, wherein pressure inside the common pipe is greater than pressure inside the first evaporation unit and pressure inside the second evaporation unit.

A control method according to the present invention is a control method for a cooling device including: a first evaporation unit and a second evaporation unit each of which receiving heat of a heat-generating body, evaporating an internally stored liquid-phase coolant by heat of the heat-generating body, and causing a gas-phase coolant to flow out; a first condensation unit being connected to the first evaporation unit, condensing a gas-phase coolant flowing out from the first evaporation unit, and causing a liquid-phase coolant to flow out; a second condensation unit being connected to the second evaporation unit, condensing a gas-phase coolant flowing out from the second evaporation unit, and causing a liquid-phase coolant to flow out; a common pipe being provided between the first evaporation unit and the first condensation unit and also between the second evaporation unit and the second condensation unit and causing a liquid-phase coolant flowing out from the first condensation unit and a liquid-phase coolant flowing out from the second condensation unit to join; a compressor being connected to the second evaporation unit and the second condensation unit and compressing a gas-phase coolant flowing out from the second evaporation unit; an expansion valve being connected to the second evaporation unit and the common pipe and expanding a liquid-phase coolant flowing out from the second condensation unit; a first valve being connected to the first evaporation unit and the common pipe and adjusting an amount of liquid-phase coolant flowing into the first evaporation unit; and a second valve being connected to the second evaporation unit unit and the common pipe and adjusting an amount of liquid-phase coolant flowing into the second evaporation unit, the control method including control processing of configuring: a free-cooling refrigeration cycle circulating a liquid-phase or gas-phase coolant among the first evaporation unit, the first condensation unit, and the common pipe; and a compression refrigeration cycle circulating a liquid-phase or gas-phase coolant among the second evaporation unit, the second condensation unit, the compressor, the expansion valve, and the common pipe, and controlling either one or both of the compressor and the expansion valve, based on a differential heat value being a heat value acquired by subtracting a heat recovery amount by the free-cooling refrigeration cycle from a heat value of the heat-generating body, wherein pressure inside the common pipe is greater than pressure inside the first evaporation unit and pressure inside the second evaporation unit.

A storage medium according to the present invention stores a control program for a cooling device including: a first evaporation unit and a second evaporation unit each of which receiving heat of a heat-generating body, evaporating an internally stored liquid-phase coolant by heat of the heat-generating body, and causing a gas-phase coolant to flow out; a first condensation unit being connected to the first evaporation unit, condensing a gas-phase coolant flowing out from the first evaporation unit, and causing a liquid-phase coolant to flow out; a second condensation unit being connected to the second evaporation unit, condensing a gas-phase coolant flowing out from the second evaporation unit, and causing a liquid-phase coolant to flow out; a common pipe being provided between the first evaporation unit and the first condensation unit and also between the second evaporation unit and the second condensation unit and causing a liquid-phase coolant flowing out from the first condensation unit and a liquid-phase coolant flowing out from the second condensation unit to join; a compressor being connected to the second evaporation unit and the second condensation unit and compressing a gas-phase coolant flowing out from the second evaporation unit; an expansion valve being connected to the second condensation unit and the common pipe and expanding a liquid-phase coolant flowing out from the second condensation unit; a first valve being connected to the first evaporation unit and the common pipe and adjusting an amount of liquid-phase coolant flowing into the first evaporation unit; and a second valve being connected to the second evaporation unit and the common pipe and adjusting an amount of liquid-phase coolant flowing into the second evaporation unit, the program causing a computer to execute control processing of configuring: a free-cooling refrigeration cycle circulating a liquid-phase or gas-phase coolant among the first evaporation unit, the first condensation unit, and the common pipe; and a compression refrigeration cycle circulating a liquid-phase or gas-phase coolant among the second evaporation unit, the second condensation unit, the compressor, the expansion valve, and the common pipe, and controlling either one or both of the compressor and the expansion valve, based on a differential heat value being a heat value acquired by subtracting a heat recovery amount by the free-cooling refrigeration cycle from a heat value of the heat-generating body, wherein pressure inside the common pipe is greater than pressure inside the first evaporation unit and pressure inside the second evaporation unit.

Advantageous Effects of Invention

The present invention can provide a cooling device and the like capable of shortening a piping length.

EXAMPLE EMBODIMENT

First Example Embodiment

Figure 1:
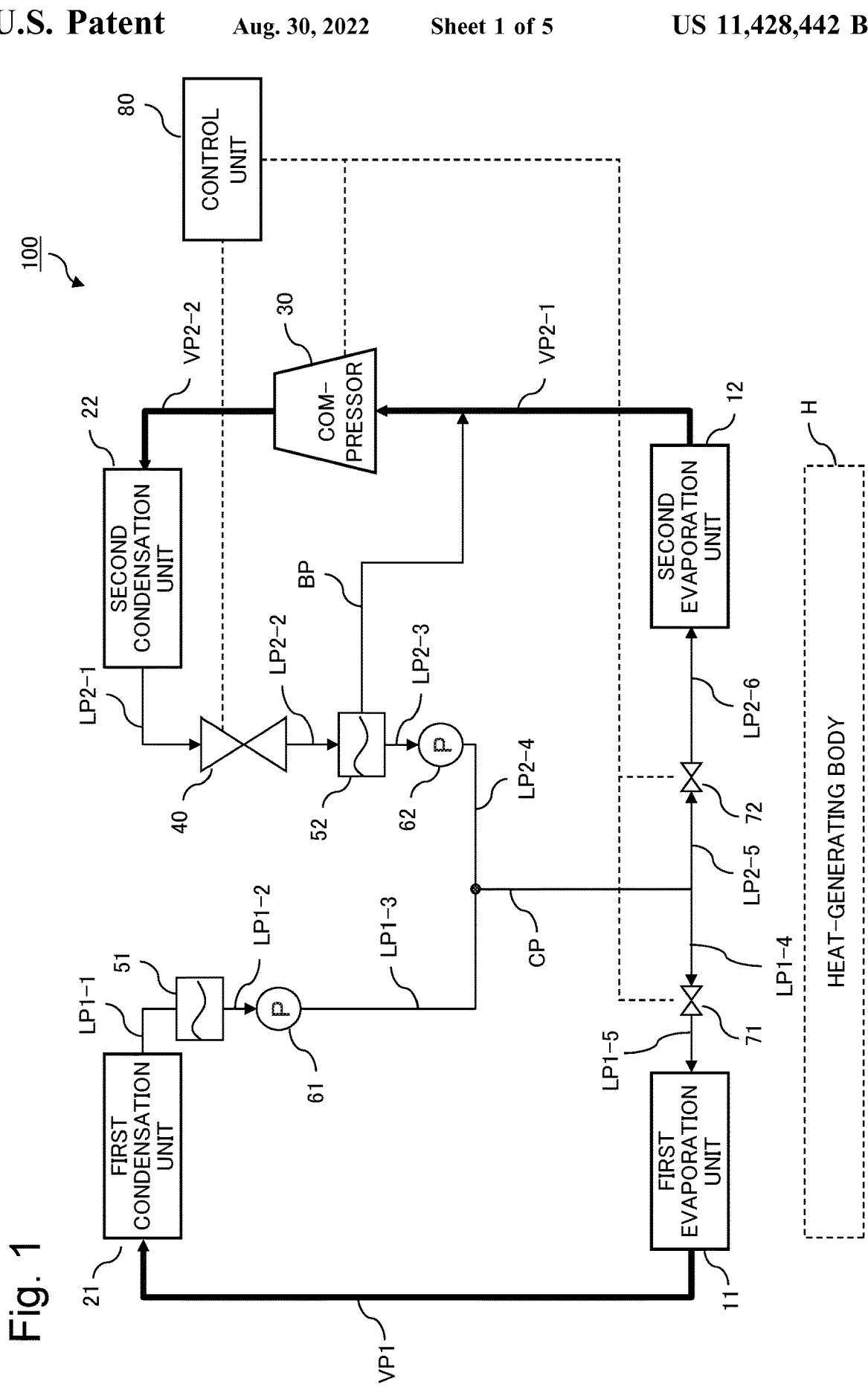
FIG. 1 is a schematic diagram illustrating a configuration of a cooling device according to a first example embodiment of the present invention.

A cooling device 100 according to a first example embodiment of the present invention will be described based on diagrams. FIG. 1 is a schematic diagram illustrating a configuration of the cooling device 100.

The cooling device 100 cools a heat-generating body H. As illustrated in FIG. 1, the cooling device 100 includes a first evaporation unit 11, a second evaporation unit 12, a first condensation unit 21, a second condensation unit 22, a compressor 30, an expansion valve 40, a first tank 51, a second tank 52, a first pump 61, a second pump 62, a first valve 71, a second valve 72, and a control unit 80.

The cooling device 100 further includes a first vapor pipe VP1 and second vapor pipes VP2-1 and VP2-2. The cooling device 100 further includes first liquid pipes LP1-1, LP1-2, LP1-3, LP1-4, and LP1-5, and second liquid pipes LP2-1, LP2-2, LP2-3, LP2-4, LP2-5, and LP2-6. The cooling device 100 further includes a bypass pipe BP and a common pipe CP.

When the second vapor pipes VP2-1 and VP2-2 do not need to be distinguished from each another, the pipes may be referred to as second vapor pipes VP2. Similarly, when the first liquid pipes LP1-1, LP1-2, LP1-3, LP1-4, and LP1-5 do not need to be distinguished from one another, the pipes may be referred to as first liquid pipes LP1. Furthermore, when the second liquid pipes LP2-1, LP2-2, LP2-3, LP2-4, LP2-5, and LP2-6 do not need to be distinguished from one another, the pipes may be referred to as second liquid pipes LP2. VP1, VP2, LP1, and LP2 are not essential components in the present example embodiment.

The first evaporation unit 11, the second evaporation unit 12, the compressor 30, the expansion valve 40, the first tank 51, the second tank 52, the first pump 61, the second pump 62, the first valve 71, and the second valve 72 are normally installed indoors. The first condensation unit 21 and the second condensation unit 22 are normally installed outdoors. Specifically, for example, the first condensation unit 21 and the second condensation unit 22 are provided outside a server room.

The heat-generating body H is a device generating heat when in operation and, for example, is an electronic device such as a server device installed inside a server room. For example, a central processing unit CPU, a multi-chip module MCM, and the like are mounted in the electronic device as parts generating heat when in operation. While it is assumed that there is one heat-generating body H in the description of the present example embodiment, a plurality of heat-generating bodies H may be provided.

The cooling device 100 circulates a coolant (hereinafter denoted as COO) between the first evaporation unit 11 and the first condensation unit 21, and also circulates a coolant COO among the first evaporation unit 11, the first condensation unit 21, the compressor 30, and the expansion valve 40.

A system circulating a coolant COO between the first evaporation unit 11 and the first condensation unit 21 through at least the common pipe CP is referred to as a free-cooling refrigeration cycle. A system circulating a coolant COO among the second evaporation unit 12, the second condensation unit 22, the compressor 30, and the expansion valve 40 through at least the common pipe CP is referred to as a compression refrigeration cycle.

A coolant undergoing a phase change between a coolant in a liquid phase (liquid-phase coolant: hereinafter denoted as LP-COO) and a coolant in a gas phase (gas-phase coolant: hereinafter denoted as GP-COO) is used as a coolant COO.

For example, hydrofluorocarbon (HFC), hydrofluoroether (HFE), or the like as a low-boiling coolant may be used as a coolant COO. For example, a substance not undergoing a phase change such as water may be used as a coolant COO.

A coolant COO is contained in a space composed of the first evaporation unit 11, the second evaporation unit 12, the first condensation unit 21, the second condensation unit 22, the compressor 30, the expansion valve 40, the first tank 51, the second tank 52, the first pump 61, the second pump 62, the first valve 71, the second valve 72, the vapor pipes VP1 and VP2, and the liquid pipes LP1 and LP2 in a hermetically sealed state. Accordingly, by evacuating the space after injecting a liquid-phase coolant LP-COO into the space, the inside of the space is always maintained at a saturated vapor pressure of the coolant.

A method of filling the space with a coolant COO is as follows. For example, a coolant COO is injected from a coolant injection hole (unillustrated) previously provided on the upper surface (a surface on the upper side of the page in FIG. 1) of the first evaporation unit 11 or the second evaporation unit 12. Then, the coolant injection hole is closed when an amount of the coolant COO reaches a predetermined amount. Further, the air is removed from the space by use of a vacuum pump (unillustrated) or the like through an air removal hole (unillustrated) previously provided on the upper surface (the surface on the upper side of the page in FIG. 1) of the first evaporation unit 11 or the second evaporation unit 12. Then, the air removal hole is closed. Thus, the cooling device 100 seals the coolant COO in the space. Consequently, the pressure inside the space in the cooling device 100 becomes equal to the saturated vapor pressure of the coolant COO, and the boiling point of the coolant COO sealed in the space becomes close to the room temperature. The coolant injection hole may also be used as the air removal hole. The above concludes the description of the method of filling with the coolant COO.

Each component of the cooling device 100 will be described below.

The first evaporation unit 11 is provided close to the heat-generating body H. For example, the first evaporation unit 11 is installed inside a server room in a data center. The first evaporation unit 11 is connected to the first condensation unit 21 through the first vapor pipe VP1. The first evaporation unit 11 is further connected to the common pipe CP through the first liquid pipes LP1-4 and 1-5 and the first valve 71. The first evaporation unit 11 internally stores a coolant COO. The first evaporation unit 11 receives heat of the heat-generating body H, evaporates an internally stored liquid-phase coolant LP-COO by the heat of the heat-generating body H, and causes a gas-phase coolant GP-COO to flow out to the first condensation unit 21. The first evaporation unit 11 has been described to be provided close to the heat-generating body H in the above description. On the other hand, the first evaporation unit 11 does not necessarily need to be provided close to the heat-generating body H as long as the unit can receive heat of the heat-generating body H.

The second evaporation unit 12 is provided close to the heat-generating body H, similarly to the first evaporation unit 11. For example, the second evaporation unit 12 is installed inside a server room in a data center. The second evaporation unit 12 is connected to the second condensation unit 22 through the compressor 30 and the second vapor pipes VP2-1 and 2-2. The second evaporation unit 12 is further connected to the common pipe CP through the second liquid pipes LP2-5 and 2-6, and the second valve 72. The second evaporation unit 12 internally stores a coolant COO. The second evaporation unit 12 receives heat of the heat-generating body H, evaporates an internally stored liquid-phase coolant LP-COO by the heat of the heat-generating body H, and causes a gas-phase coolant GP-COO to flow out to the second condensation unit 22 through the compressor 30. The second evaporation unit 12 has been described to be provided close to the heat-generating body H in the above description. On the other hand, the second evaporation unit 12 does not necessarily need to be provided close to the heat-generating body H as long as the unit can receive heat of the heat-generating body H.

For example, the first condensation unit 21 is installed outside a server room in a data center. For example, the first condensation unit 21 is configured with a radiator. The first condensation unit 21 may also be configured with a radiator and a fan. The first condensation unit 21 is connected to the first evaporation unit 11 through the first vapor pipe VP1. The first condensation unit 21 is further connected to the common pipe CP through the first tank 51, the first pump 61, and the first liquid pipes LP1-1, 1-2, and 1-3. The first condensation unit 21 condenses a gas-phase coolant GP-COO flowing out from the first evaporation unit 11 and causes a liquid-phase coolant LP-COO to flow out. Specifically, by heat exchange using a temperature difference from the air outside the server room, the first condensation unit 21 cools a gas-phase coolant GP-COO flowing out from the first evaporation unit 11, generates a liquid-phase coolant LP-COO, and causes the liquid-phase coolant LP-COO to flow out.

For example, the second condensation unit 22 is installed outside a server room in a data center, similarly to the first condensation unit 21. For example, the second condensation unit 22 is configured with a radiator. The second condensation unit 22 may also be configured with a radiator and a fan. The second condensation unit 22 is connected to the second evaporation unit 12 through the compressor 30 and the second vapor pipes VP2-1 and 2-2. The second condensation unit 22 is further connected to the common pipe CP through the expansion valve 40, the second tank 52, the second pump 62, and the second liquid pipes LP2-1, 2-2, 2-3, and 2-4. The second condensation unit 22 condenses a gas-phase coolant GP-COO flowing out from the second evaporation unit 12 and causes a liquid-phase coolant LP-COO to flow out. Specifically, by heat exchange using a temperature difference from the air outside the server room, the second condensation unit 22 cools a gas-phase coolant GP-COO flowing out from the second evaporation unit 12, generates a liquid-phase coolant LP-COO, and causes the liquid-phase coolant LP-COO to flow out.

The compressor 30 is connected to the second evaporation unit 12 through the second vapor pipe VP2-1. The compressor 30 is further connected to the second condensation unit 22 through the second vapor pipe VP2-2. The compressor 30 compresses a gas-phase coolant GP-COO flowing out from the second evaporation unit 12. Then, the compressor 30 causes the gas-phase coolant GP-COO compressed by the compressor 30 to flow out to the second condensation unit 22. The compressor 30 operates in accordance with an instruction provided by the control unit 80.

The expansion valve 40 is connected to the second condensation unit 22 through the second liquid pipe LP2-1. The expansion valve 40 is further connected to the common pipe CP through the second tank 52, the second pump 62, and the second liquid pipes LP2-2, 2-3, and 2-4. The expansion valve 40 expands a liquid-phase coolant LP-COO flowing out from the second condensation unit 22. The expansion valve 40 operates in accordance with an instruction provided by the control unit 80.

The first tank 51 is connected to the first condensation unit 21 through the first liquid pipe LP1-1. The first tank 51 is connected to the first pump 61 through the first liquid pipe LP1-2. The first tank 51 is preferably provided between the first condensation unit 21 and the common pipe CP and also on the upper side of the first pump 61 in the vertical direction. The first tank 51 stores a liquid-phase coolant LP-COO flowing out from the first condensation unit 21.

The second tank 52 is connected to the second condensation unit 22 through the expansion valve 40 and the second liquid pipes LP2-1 and 2-2. The second tank 52 is connected to the second pump 62 through the second liquid pipe LP2-3. The second tank 52 is preferably provided between the second condensation unit 22 and the common pipe CP and also on the upper side of the second pump 62 in the vertical direction. The second tank 52 stores a liquid-phase coolant LP-COO flowing out from the second condensation unit 22.

The first pump 61 is connected to the first condensation unit 21 through the first tank 51 and the liquid pipes LP1-1 and 1-2. The first pump 61 is further connected to the common pipe CP through the liquid pipe LP1-3. The first pump 61 is preferably provided between the first condensation unit 21 and the common pipe CP. The first pump 61 operates in accordance with an instruction provided by the control unit 80. The first pump 61 conveys a liquid-phase coolant LP-COO flowing out from the first condensation unit 21 to the common pipe CP in such a way that pressure P0 inside the common pipe CP is greater than pressure P1 inside the first evaporation unit 11 and pressure P2 inside the second evaporation unit 12. Specifically, maximum values P1max and P2max of the pressure P1 inside the first evaporation unit 11 and the pressure P2 inside the second evaporation unit 12 are preset. Then, the control unit 80 sets an output of the first pump 61 in such a way that the minimum value of the pressure P0 inside the common pipe CP is equal to or more than the maximum values P1max and P2max of the pressure P1 inside the first evaporation unit 11 and the pressure P2 inside the second evaporation unit 12.

In addition, the first pump 61 conveys a liquid-phase coolant LP-COO flowing out from the first condensation unit 21 to the common pipe CP according to a surface level of a liquid-phase coolant LP-COO in the first tank 51. More specifically, the first pump 61 conveys the liquid-phase coolant LP-COO flowing out from the first condensation unit 21 to the common pipe CP in such a way that the surface is kept constant, by use of a liquid-level meter (unillustrated) mounted in the first tank 51.

When a big difference is caused between amounts of liquid-phase coolant LP-COO evaporated in the first evaporation unit 11 and the second evaporation unit 12, and amounts of liquid-phase coolant LP-COO conveyed by the first pump 61 and the second pump 62, the first tank 51 enters an exhausted state or a flooded state. When the first tank 51 enters the exhausted state, a motor in the first pump 61 idles and a cooling function of the cooling device 100 is degraded. When the first tank 51 enters the flooded state, a liquid-phase coolant LP-COO in the first condensation unit 21 increases and the liquid-phase coolant LP-COO flows into the vapor pipe VP1, and the cooling function of the cooling device 100 is degraded. Accordingly, the first pump 61 performs an operation of avoiding entry of the first tank 51 into the exhausted state or the flooded state, in accordance with an instruction provided by the control unit 80. Specifically, the first pump 61 increases an amount of delivery of liquid-phase coolant LP-COO by the first pump 61 when the surface of the liquid-phase coolant LP-COO in the first tank 51 rises, and decreases the amount of delivery of liquid-phase coolant LP-COO by the first pump 61 when the surface of the liquid-phase coolant LP-COO in the first tank 51 falls.

The second pump 62 is connected to the second condensation unit 22 through the second tank 52, the expansion valve 40, and the liquid pipes LP2-1, 2-2, and 2-3. The second pump 62 is further connected to the common pipe CP through the liquid pipe LP2-4. The second pump 62 is preferably provided between the second condensation unit 22 and the common pipe CP. The second pump 62 operates in accordance with an instruction provided by the control unit 80. The second pump 62 conveys a liquid-phase coolant LP-COO flowing out from the second condensation unit 22 to the common pipe CP in such a way that the pressure P0 inside the common pipe CP is greater than the pressure P1 inside the first evaporation unit 11 and the pressure P2 inside the second evaporation unit 12. Specifically, the maximum values P1max and P2max of the pressure P1 inside the first evaporation unit 11 and the pressure P2 inside the second evaporation unit 12 are preset, similarly to the aforementioned description of the first pump 61. Then, the control unit 80 sets an output of the second pump 62 in such a way that the minimum value of the pressure P0 inside the common pipe CP is equal to or more than the maximum values P1max and P2max of the pressure P1 inside the first evaporation unit 11 and the pressure P2 inside the second evaporation unit 12.

In addition, the second pump 62 conveys a liquid-phase coolant LP-COO flowing out from the second condensation unit 22 to the common pipe CP according to a surface level of a liquid-phase coolant LP-COO in the second tank 52. More specifically, the second pump 62 conveys the liquid-phase coolant LP-COO flowing out from the second condensation unit 22 to the common pipe CP in such a way that the surface is kept constant, by use of a liquid-level meter (unillustrated) mounted in the second tank 52.

When a big difference is caused between amounts of liquid-phase coolant LP-COO evaporated in the first evaporation unit 11 and the second evaporation unit 12, and amounts of liquid-phase coolant LP-COO conveyed by the first pump 61 and the second pump 62, the second tank 52 enters the exhausted state or the flooded state. When the second tank 52 enters the exhausted state, a motor in the second pump 62 idles and the cooling function of the cooling device 100 is degraded. When the second tank 52 enters the flooded state, a liquid-phase coolant LP-COO in the second condensation unit 22 increases and the liquid-phase coolant LP-COO flows into the vapor pipe VP2, and the cooling function of the cooling device 100 is degraded. Accordingly, the second pump 62 performs an operation of avoiding entry of the second tank 52 into the exhausted state or the flooded state, in accordance with an instruction provided by the control unit 80. Specifically, the second pump 62 increases an amount of delivery of liquid-phase coolant LP-COO by the second pump 62 when the surface of the liquid-phase coolant LP-COO in the second tank 52 rises, and decreases the amount of delivery of liquid-phase coolant LP-COO by the second pump 62 when the surface of the liquid-phase coolant LP-COO in the second tank 52 falls.

The first valve 71 is connected to the first evaporation unit 11 through the first liquid pipe LP1-5. The first valve 71 is further connected to the common pipe CP through the first liquid pipe LP1-4. The first valve 71 is provided between the first evaporation unit 11 and the common pipe CP. The first valve 71 adjusts an amount of liquid-phase coolant LP-COO flowing into the first evaporation unit 11. The first valve 71 operates in accordance with an instruction provided by the control unit 80. For example, in accordance with an instruction provided by the control unit 80, the first valve 71 adjusts an amount of coolant COO flowing into the first evaporation unit 11, based on a heat recovery amount Q1 of the first evaporation unit 11. A specific operation of the first valve 71 will be described in detail in a description of operation to be described later.

The second valve 72 is connected to the second evaporation unit 12 through the second liquid pipe LP2-6. The second valve 72 is further connected to the common pipe CP through the second liquid pipe LP2-5. The second valve 72 is provided between the second evaporation unit 12 and the common pipe CP. The second valve 72 adjusts an amount of liquid-phase coolant LP-COO flowing into the second evaporation unit 12. The second valve 72 operates in accordance with an instruction provided by the control unit 80. For example, in accordance with an instruction provided by the control unit 80, the second valve 72 adjusts an amount of coolant COO flowing into the second evaporation unit 12, based on a heat recovery amount Q2 of the second evaporation unit 12. A specific operation of the second valve 72 will be described in detail in the description of operation to be described later.

The control unit 80 is communicably connected to at least the compressor 30, the expansion valve 40, the first valve 71, and the second valve 72 in a wired or wireless manner. The control unit 80 controls the entire cooling device 100. The control unit 80 particularly controls the compressor 30, the expansion valve 40, the first valve 71, and the second valve 72.

Next, a piping relation will be described. The vapor pipe VP1 connects to the first evaporation unit 11 and the first condensation unit 21. The liquid pipes LP1-1 to 3 connect between the first condensation unit 21 and the common pipe CP through the first tank 51 and the first pump 61. The liquid pipes LP1-4 and 1-5 connect between the common pipe CP and the first evaporation unit 11 through the first valve 71. The vapor pipe VP2-1 connects between the second evaporation unit 12 and the compressor 30. The vapor pipe VP2-2 connects between the compressor 30 and the second condensation unit 22. The liquid pipe LP2-1 connects between the second condensation unit 22 and the expansion valve 40. The liquid pipes LP2-2 to 4 connect between the expansion valve 40 and the common pipe CP through the second tank 52 and the second pump 62. The liquid pipes LP2-5 and 2-6 connect between the common pipe CP and the second evaporation unit 12 through the second valve 72. One end of the common pipe CP is connected to the liquid pipe LP1-3 and the liquid pipe LP2-4, and the other end of the common pipe CP is connected to the liquid pipe LP1-4 and the liquid pipe LP2-5. The bypass pipe BP connects between the second tank 52 and the vapor pipe VP2-1. The connecting part of the bypass pipe BP and the second tank 52 is provided on the upper side in the vertical direction out of sides of the second tank 52. The bypass pipe BP is provided is such a way that a gas-phase coolant GP-COO collecting on the upper side in the vertical direction in the second tank 52 flows into the vapor pipe VP2-1.

Next, an operation of the cooling device 100 will be described. An operation of the cooling device 100 in the free-cooling refrigeration cycle and an operation of the cooling device 100 in the compression refrigeration cycle will be separately described. While the operation of the cooling device 100 in the free-cooling refrigeration cycle and the operation of the cooling device 100 in the compression refrigeration cycle will be separately described, the free-cooling refrigeration cycle and the compression refrigeration cycle actually operate simultaneously.

First, the operation of the cooling device 100 in the free-cooling refrigeration cycle will be described. As described above, the free-cooling refrigeration cycle is a system circulating a coolant COO between the first evaporation unit 11 and the first condensation unit 21 through at least the common pipe CP.

The first evaporation unit 11 receives heat of the heat-generating body H, evaporates an internally stored liquid-phase coolant LP-COO by heat of the heat-generating body H, and causes a gas-phase coolant GP-COO to flow out to the first condensation unit 21 through the vapor pipe VP1. Consequently, the gas-phase coolant GP-COO flows into the first condensation unit 21.

Next, the first condensation unit 21 condenses the gas-phase coolant GP-COO flowing out from the first evaporation unit 11 and causes a liquid-phase coolant LP-COO to flow out. Specifically, by heat exchange using a temperature difference from the air outside the server room, the first condensation unit 21 cools the gas-phase coolant GP-COO flowing out from the first evaporation unit 11, generates a liquid-phase coolant LP-COO, and causes the liquid-phase coolant LP-COO to flow out.

The liquid-phase coolant LP-COO generated by the first condensation unit 21 flows into the first tank 51 and is temporarily stored in the first tank 51.

As described in the configuration description, in accordance with an instruction provided by the control unit 80, the first pump 61 conveys the liquid-phase coolant LP-COO flowing out from the first condensation unit 21 to the common pipe CP in such a way that the pressure P0 inside the common pipe CP is greater than the pressure P1 inside the first evaporation unit 11 and the pressure P2 inside the second evaporation unit 12. Further, the first pump 61 conveys the liquid-phase coolant LP-COO flowing out from the first condensation unit 21 to the common pipe CP according to a surface level of the liquid-phase coolant LP-COO in the first tank 51. Specifically, when the surface of the liquid-phase coolant LP-COO in the first tank 51 rises, the control unit 80 outputs, to the first pump 61, an instruction to increase an amount of delivery of liquid-phase coolant LP-COO by the first pump 61. When the surface of the liquid-phase coolant LP-COO in the first tank 51 falls, the control unit 80 outputs, to the first pump 61, an instruction to decrease the amount of delivery of liquid-phase coolant LP-COO by the first pump 61. Then, in accordance with the instruction provided by the control unit 80, the first pump 61 increases the amount of delivery of liquid-phase coolant LP-COO by the first pump 61 when the surface of the liquid-phase coolant LP-COO in the first tank 51 rises, and decreases the amount of delivery of liquid-phase coolant LP-COO by the first pump 61 when the surface of the liquid-phase coolant LP-COO in the first tank 51 falls.

The liquid-phase coolant LP-COO delivered by the first pump 61 flows into the common pipe CP through the liquid pipe LP1-3. At this time, the liquid-phase coolant LP-COO delivered by the first pump 61 joins, in the common pipe CP, a liquid-phase coolant LP-COO delivered by the second pump 62.

Part of the liquid-phase coolant LP-COO flowing through the common pipe CP flows into the first evaporation unit 11 through the first valve 71 and the first liquid pipes LP1-4 and 1-5, according to a degree of opening of the first valve 71.

As will be described in detail in a description of operation of the cooling device 100 in the compression refrigeration cycle, the remainder of the liquid-phase coolant LP-COO flowing through the common pipe CP flows into the second evaporation unit 12 through the second valve 72 and the second liquid pipes LP2-5 and 2-6, according to a degree of opening of the second valve 72.

Adjustment of the degree of opening of the first valve 71 will be described. As described above, for example, in accordance with an instruction provided by the control unit 80, the first valve 71 adjusts an amount of coolant COO flowing into the first evaporation unit 11, based on the heat recovery amount Q1 of the first evaporation unit 11.

Specifically, the control unit 80 calculates the heat recovery amount Q1 of the first evaporation unit 11. Denoting latent heat of a coolant COO as α (J/kg) and a flow rate of the coolant COO flowing into the first evaporation unit 11 as w1 (kg/s), the heat recovery amount Q1 (W) of the first evaporation unit 11 can be roughly estimated according to the following equation 1.

$$Q1 \approx \alpha \times w1 \quad \text{(equation 1)}$$

Note that α is determined by a characteristic of the coolant COO, and w1 can be measured by providing a flowmeter in the liquid pipe LP1-4. Further, α is stored in a storage unit (unillustrated). The control unit 80 calculates Q1 by multiplying α stored in the storage unit by a measured value of w1, according to equation 1. Then, the control unit 80 compares the measured value of Q1 with a threshold value Qo1 of Q1. For example, the threshold value Qo1 of Q1 is determined based on a value determined by an advance performance evaluation.

Then, when the measured value of Q1 is determined to be greater than the threshold value Qo1 by the control unit 80, the control unit 80 outputs, to the first valve 71, an instruction to decrease the degree of opening of the first valve 71. The first valve 71 decreases the degree of opening in accordance with the instruction provide by the control unit 80. Consequently, the flow rate w1 of the coolant COO flowing into the first evaporation unit 11 decreases, and Q1 also decreases.

When the measured value of Q1 is determined to be less than the threshold value Qo1 by the control unit 80, the control unit 80 outputs, to the first valve 71, an instruction to increase the degree of opening of the first valve 71. The first valve 71 increases the degree of opening in accordance with the instruction provided by the control unit 80. Consequently, the flow rate w1 of the coolant COO flowing into the first evaporation unit 11 increases, and Q1 also increases.

Thus, Q1 is controlled in such a way as to approach the threshold value Qo1 by the control unit 80.

As described above, under an instruction of the control unit 80, the first valve 71 adjusts the degree of opening of the first valve 71, based on the heat recovery amount Q1 of the first evaporation unit 11. By keeping the heat recovery amount Q1 of the first evaporation unit 11 at the threshold value Qo1 (a constant value), the flow rate w1 of the coolant COO flowing into the first evaporation unit 11 is adjusted, and mixing of a liquid-phase coolant LP-COO into the vapor pipe VP1 is suppressed. Consequently, the cooling device 100 can stabilize the pressure inside the vapor pipe VP1, reduce pressure loss between the first evaporation unit 11 and the first condensation unit 21, and suppress reduction in the heat recovery amount Q1 of the first evaporation unit 11.

Another method of adjusting the degree of opening of the first valve 71 will be described. For example, in accordance with an instruction provided by the control unit 80, the first valve 71 may also adjust an amount of coolant COO flowing into the first evaporation unit 11, based on a degree of superheat H1 of the first evaporation unit 11.

Denoting the temperature of a coolant COO flowing out from the first evaporation unit 11 as T1 (° C.) and the temperature of the coolant COO at a saturated vapor pressure P0 as Ts(P0) (° C.), the degree of superheat H1 (° C.) of the first evaporation unit 11 can be calculated according to the following equation 2.

$$H1 = T1 - Ts(P0) \qquad \text{(equation 2)}$$

Note that Ts(P0) is determined according to the saturated vapor pressure P0 and is a constant when P0 is fixed. T1 can be measured by providing a thermometer in the vapor pipe VP1. A table listing a saturated vapor pressure P1 and Ts(P0) is stored in a storage unit (unillustrated). The control unit 80 calculates H1 by subtracting Ts(P0) stored in the storage unit from a measured value of T1, according to equation 2. Then, the control unit 80 compares the measured value of H1 with a threshold value Ho1 of H1 [such as Ho1=3 (° C.)]. For example, the threshold value Ho1 of H1 is determined based on a value determined by an advance performance evaluation.

Then, when the measured value of H1 is determined to be greater than the threshold value Ho1 by the control unit 80, the control unit 80 outputs, to the first valve 71, an instruction to increase the degree of opening of the first valve 71. The first valve 71 increases the degree of opening in accordance with the instruction provided by the control unit 80. Consequently, the flow rate w1 of the coolant COO flowing into the first evaporation unit 11 increases, and Q1 also increases according to equation 1. When the heat recovery amount Q1 by the first evaporation unit 11 increases, temperature T1 of the gas-phase coolant GP-COO flowing out to the vapor pipe VP1 decreases, and therefore the degree of superheat H1 of the first evaporation unit 11 decreases.

When the measured value of H1 is determined to be less than the threshold value Ho1 by the control unit 80, the control unit 80 outputs, to the first valve 71, an instruction to decrease the degree of opening of the first valve 71. The first valve 71 decreases the degree of opening in accordance with the instruction provided by the control unit 80. Consequently, the flow rate w1 of the coolant COO flowing into the first evaporation unit 11 decreases, and Q1 also decreases according to equation 1. When the heat recovery amount Q1 by the first evaporation unit 11 decreases, the temperature T1 of the gas-phase coolant GP-COO flowing out to the vapor pipe VP1 increases, and therefore the degree of superheat H1 of the first evaporation unit 11 increases.

Thus, H1 is controlled in such a way as to approach the threshold value Ho1 by the control unit 80.

As described above, the first valve 71 may also, under an instruction of the control unit 80, adjust the degree of opening of the first valve 71, based on the degree of superheat H1 of the first evaporation unit 11. By keeping the degree of superheat H1 of the first evaporation unit 11 at the threshold value Ho1 (a constant value), the flow rate w1 of a coolant COO flowing into the first evaporation unit 11 is adjusted, and mixing of a liquid-phase coolant LP-COO into the vapor pipe VP1 is suppressed. Consequently, the cooling device 100 can stabilize the pressure inside the vapor pipe VP1, reduce pressure loss between the first evaporation unit 11 and the first condensation unit 21, and suppress reduction in the heat recovery amount Q1 of the first evaporation unit.

Next, the operation of the cooling device 100 in the compression refrigeration cycle will be described. As described above, the compression refrigeration cycle is a system circulating a coolant COO among the second evaporation unit 12, the second condensation unit 22, the compressor 30, and the expansion valve 40 through at least the common pipe CP.

The second evaporation unit 12 receives heat of the heat-generating body H, evaporates an internally stored liquid-phase coolant LP-COO by the heat of the heat-generating body H, and causes a gas-phase coolant GP-COO to flow out toward the compressor 30 through the vapor pipe VP2-1. Consequently, the gas-phase coolant GP-COO flows into the compressor 30.

The compressor 30 compresses the gas-phase coolant GP-COO flowing out from the second evaporation unit 12. Consequently, the pressure and the temperature of the gas-phase coolant GP-COO rise. Then, the compressor 30 causes the gas-phase coolant GP-COO compressed by the compressor 30 to flow out to the second condensation unit 22. Consequently, the gas-phase coolant GP-COO flows into the second condensation unit 22. Details of the operation of the compressor 30 will be described later.

Next, the second condensation unit 22 condenses the gas-phase coolant GP-COO flowing out from the compressor 30 and causes a liquid-phase coolant LP-COO to flow out. Specifically, by heat exchange using a temperature difference from the air outside the server room, the second condensation unit 22 cools the gas-phase coolant GP-COO flowing out from the compressor 30, generates a liquid-phase coolant LP-COO, and causes the liquid-phase coolant LP-COO to flow out.

The liquid-phase coolant LP-COO generated by the second condensation unit 22 flows into the expansion valve 40. The expansion valve 40 expands the liquid-phase coolant LP-COO flowing out from the second condensation unit 22. The liquid-phase coolant LP-COO expanded by the expansion valve 40 flows into the second tank 52 and is temporarily stored in the second tank 52. Details of the operation of the expansion valve 40 will be described later.

The coolant flowing into the second tank 52 from the expansion valve 40 may contain a gas-phase coolant GP-COO mixed with the liquid-phase coolant LP-COO. The gas-phase coolant GP-COO in the coolant COO stored in the second tank 52 moves upward in the vertical direction, flows into the bypass pipe BP, and flows into the second liquid pipe VP2-1.

As described in the configuration description, in accordance with an instruction provided by the control unit 80, the second pump 62 conveys a liquid-phase coolant LP-COO flowing out from the second condensation unit 22 to the common pipe CP through the expansion valve 40 in such a way that the pressure P0 inside the common pipe CP is greater than the pressure P1 inside the first evaporation unit 11 and the pressure P2 inside the second evaporation unit 12. Further, the second pump 62 conveys the liquid-phase coolant LP-COO flowing out from the second condensation unit 22 to the common pipe CP, according to a surface level of the liquid-phase coolant LP-COO in the second tank 52. Specifically, when the surface of the liquid-phase coolant LP-COO in the second tank 52 rises, the control unit 80 outputs, to the second pump 62, an instruction to increase an amount of delivery of liquid-phase coolant LP-COO by the second pump 62. In accordance with the instruction provided by the control unit 80, the second pump 62 increases the amount of delivery of liquid-phase coolant LP-COO by the second pump 62 when the surface of the liquid-phase coolant LP-COO in the second tank 52 rises, and decreases the amount of delivery of liquid-phase coolant LP-COO by the second pump 62 when the surface of the liquid-phase coolant LP-COO in the second tank 52 falls.

The liquid-phase coolant LP-COO delivered by the second pump 62 flows into the common pipe CP through the liquid pipe LP2-4. At this time, the liquid-phase coolant LP-COO delivered by the second pump 62 joins, in the common pipe CP, a liquid-phase coolant LP-COO delivered by the first pump 61.

As described above, part of the liquid-phase coolant LP-COO flowing through the common pipe CP flows into the first evaporation unit 11 through the first valve 71 and the first liquid pipes LP1-4 and 1-5, according to the degree of opening of the first valve 71. Then, the remainder of the liquid-phase coolant LP-COO flowing through the common pipe CP flows into the second evaporation unit 12 through the second valve 72 and the second liquid pipes LP2-5 and 2-6, according to the degree of opening of the second valve 72.

Adjustment of the degree of opening of the second valve 72 will be described. The adjustment of the degree of opening of the second valve 72 is similar to the adjustment of the degree of opening of the first valve 71. As described above, for example, in accordance with an instruction provided by the control unit 80, the second valve 72 adjusts an amount of coolant COO flowing into the second evaporation unit 12, based on the heat recovery amount Q2 of the second evaporation unit 12.

Specifically, the control unit 80 calculates the heat recovery amount Q2 of the second evaporation unit 12. Denoting latent heat of a coolant COO as a (J/kg) and a flow rate of the coolant COO flowing into the second evaporation unit 12 as w2 (kg/s), the heat recovery amount Q2 (W) of the second evaporation unit 12 can be roughly estimated according to the following equation 3.

$$Q2 \approx \alpha \times w2 \qquad \text{(equation 3)}$$

Note that $\alpha$ is determined by a characteristic of the coolant COO, and w2 can be measured by providing a flowmeter in the liquid pipe LP2-5. Further, $\alpha$ is stored in a storage unit (unillustrated). The control unit 80 calculates Q2 by multiplying $\alpha$ stored in the storage unit by a measured value of w2, according to equation 3. Then, the control unit 80 compares the measured value of Q2 with a threshold value Qo2 of Q2. For example, the threshold value Qo2 of Q2 is determined based on a value determined by an advance performance evaluation.

Then, when the measured value of Q2 is determined to be greater than the threshold value Qo2 by the control unit 80, the control unit 80 outputs, to the second valve 72, an instruction to decrease the degree of opening of the second valve 72. The second valve 72 decreases the degree of opening in accordance with the instruction provided by the control unit 80. Consequently, the flow rate w2 of the coolant COO flowing into the second evaporation unit 12 decreases, and Q2 also decreases.

When the measured value of Q2 is determined to be less than the threshold value Qo2 by the control unit 80, the control unit 80 outputs, to the second valve 72, an instruction to increase the degree of opening of the second valve 72. The second valve 72 increases the degree of opening in accordance with the instruction provided by the control unit 80. Consequently, the flow rate w2 of the coolant COO flowing into the second evaporation unit 12 increases, and Q2 also increases.

Thus, Q2 is controlled in such a way as to approach the threshold value Qo2 by the control unit 80.

As described above, under an instruction of the control unit 80, the second valve 72 adjusts the degree of opening of the second valve 72, based on the heat recovery amount Q2 of the second evaporation unit 12. By keeping the heat recovery amount Q2 of the second evaporation unit 12 at the threshold value Qo2 (a constant value), the flow rate w2 of a coolant COO flowing into the second evaporation unit 12 is adjusted, and mixing of a liquid-phase coolant LP-COO into the vapor pipe VP2-1 is suppressed. Consequently, the cooling device 100 can stabilize the pressure inside the vapor pipe VP2-1, reduce pressure loss between the evaporation unit 12 and the condensation unit 22, and suppress reduction in the heat recovery amount Q2 of the second evaporation unit 12.

Another method of adjusting the degree of opening of the second valve 72 will be described. The other adjustment method of the degree of opening of the second valve is also similar to the adjustment of the degree of opening of the first valve 71.

For example, the second valve 72 may, in accordance with an instruction provided by the control unit 80, adjust an amount of coolant COO flowing into the second evaporation unit 12, based on a degree of superheat H2 of the second evaporation unit 12.

Denoting the temperature of a coolant COO flowing out from the second evaporation unit 12 as T2 (° C.) and the temperature of the coolant COO at a saturated vapor pressure P0 as Ts(P0) (° C.), the degree of superheat H2 (° C.) of the second evaporation unit 12 can be calculated according to the following equation 4.

$$H2 = T2 - Ts(P0) \qquad \text{(equation 4)}$$

As described above, Ts(P0) is determined according to the saturated vapor pressure P0 and is a constant when P0 is fixed. T2 can be measured by providing a thermometer in the vapor pipe VP2-1. A table listing a saturated vapor pressure P0 and Ts(P0) is stored in a storage unit (unillustrated). The control unit 80 calculates H2 by subtracting Ts(P0) stored in the storage unit from a measured value of T2, according to equation 4. Then, the control unit 80 compares the measured value of H2 with a threshold value Ho2 of H2 [such as Ho2=3 (° C.)]. For example, the threshold value Ho2 of H2 is determined based on a value determined by an advance performance evaluation.

Then, when the measured value of H2 is determined to be greater than the threshold value Ho2 by the control unit 80, the control unit 80 outputs, to the second valve 72, an instruction to increase the degree of opening of the second valve 72. The second valve 72 increases the degree of opening in accordance with the instruction provided by the control unit 80. Consequently, the flow rate w2 of the coolant COO flowing into the second evaporation unit 12 increases, and Q2 also increases according to equation 3. When the heat recovery amount Q2 by the second evaporation unit 12 increases, temperature T2 of the gas-phase coolant GP-COO flowing out to the vapor pipe VP2-1 decreases, and therefore the degree of superheat H2 of the second evaporation unit 12 decreases.

When the measured value of H2 is determined to be less than the threshold value Ho2 by the control unit 80, the control unit 80 outputs, to the second valve 72, an instruction to decrease the degree of opening of the second valve 72. The second valve 72 decreases the degree of opening in accordance with the instruction provided by the control unit 80. Consequently, the flow rate w2 of the coolant COO flowing into the second evaporation unit 12 decreases, and Q2 also decreases according to equation 3. When the heat recovery amount Q2 by the second evaporation unit 12 decreases, the temperature T2 of the gas-phase coolant GP-COO flowing out to the vapor pipe VP2-1 increases, and therefore the degree of superheat H2 of the second evaporation unit 12 increases.

Thus, H2 is controlled in such a way as to approach the threshold value Ho2 by the control unit 80.

As described above, the second valve 72 may also, under an instruction of the control unit 80, adjust the degree of opening of the second valve 72, based on the degree of superheat H2 of the second evaporation unit 12. By keeping the degree of superheat H2 of the second evaporation unit 12 at the threshold value Ho2 (a constant value), the flow rate w2 of the coolant COO flowing into the second evaporation unit 12 is adjusted, and mixing of a liquid-phase coolant LP-COO into the vapor pipe VP2 is suppressed. Consequently, the cooling device 100 can stabilize the pressure inside the vapor pipe VP2-1, reduce pressure loss between the second evaporation unit 12 and the second condensation unit 22, and suppress reduction in the heat recovery amount Q2 of the second evaporation unit 12.

As described above, while the operation of the cooling device 100 in the free-cooling refrigeration cycle and the operation of the cooling device 100 in the compression refrigeration cycle have been separately described, the free-cooling refrigeration cycle and the compression refrigeration cycle actually operate simultaneously.

Next, control of the compressor 30 and the expansion valve 40 will be described.

Figure 2:
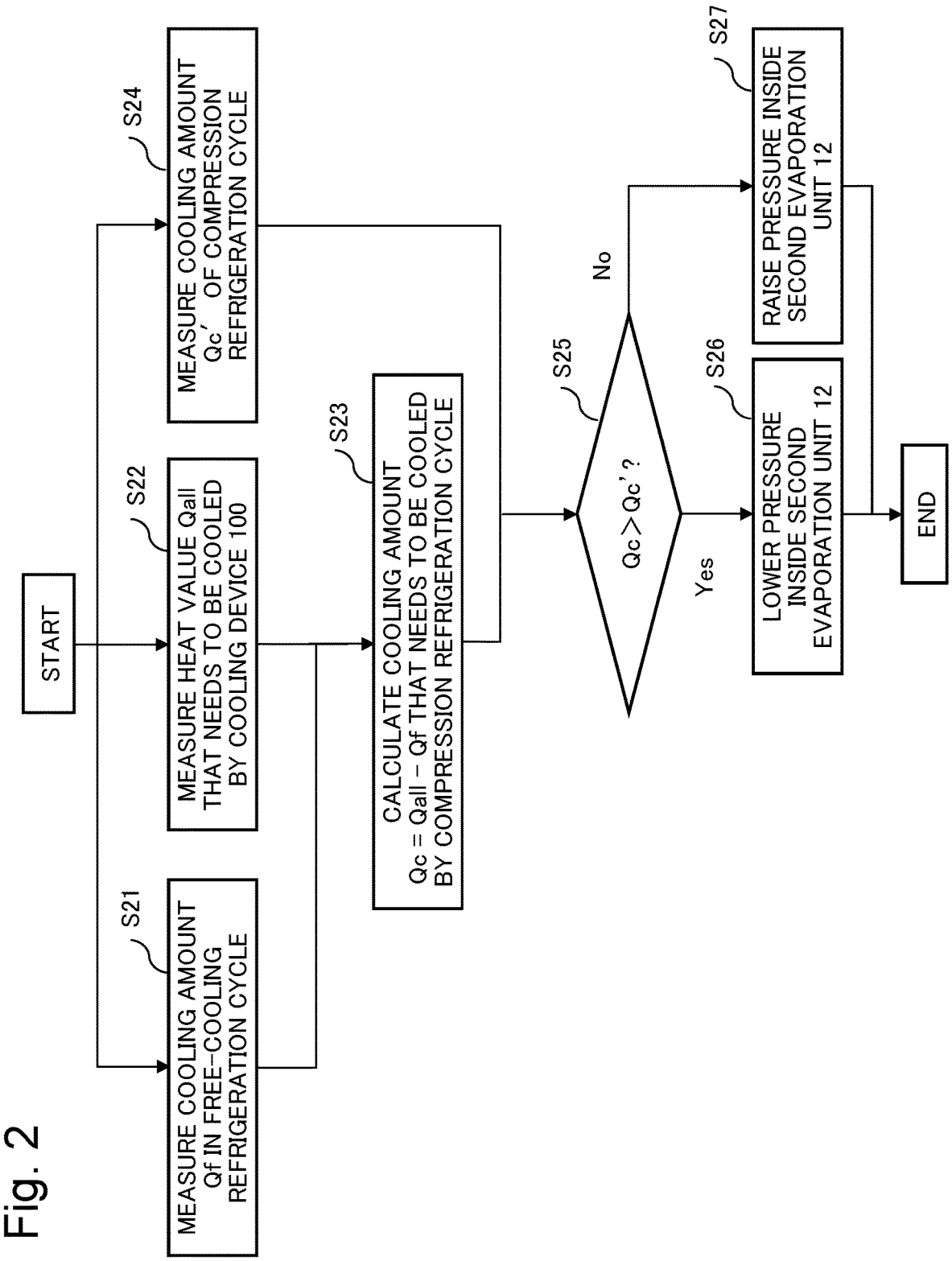
FIG. 2 is a flowchart for illustrating control of a compressor and an expansion valve.

FIG. 2 is a flowchart for illustrating the control of the compressor 30 and the expansion valve 40.

As illustrated in FIG. 2, first, the control unit 80 measures a cooling amount Qf in the free-cooling refrigeration cycle [Step (hereinafter simply denoted as S) 21]. Qf is also referred to as a heat recovery amount by the free-cooling refrigeration cycle. At this time, a coolant thermometer (unillustrated) and a coolant flowmeter (unillustrated) for measuring temperature and a flow rate of a coolant COO are provided in the liquid pipe LP1-1 connecting between the first condensation unit 21 and the first tank 51. The coolant thermometer (unillustrated) and the coolant flowmeter (unillustrated) provided in the liquid pipe LP1-1 measure temperature T5 and a flow rate w5 of a coolant COO flowing through the liquid pipe LP1-1, in accordance with an instruction provided by the control unit 80.

Denoting a cooling amount of a coolant COO per unit mass at the specific temperature T5 as ß (J/kg) and a flow rate of the coolant COO flowing through the liquid pipe LP1-1 as w5 (kg/s), the cooling amount Qf (W) in the free-cooling refrigeration cycle can be roughly estimated according to the following equation 5.

$$Qf = ß \times w5 \quad \text{(equation 5)}$$

Note that ß is stored in a storage unit (unillustrated). Specifically, while ß varies with the temperature of the coolant COO, the storage unit stores data of ß for each temperature. The control unit 80 calculates Qf by multiplying ß stored in the storage unit by a measured value of w5, according to equation 5.

The temperature of a coolant COO flowing through the pipe LP1-2 may be denoted as the specific temperature T5, and a flow rate of the coolant COO flowing through the liquid pipe LP1-2 may be denoted as w5. In this case, a coolant thermometer (unillustrated) and a coolant flowmeter (unillustrated) for measuring temperature and a flow rate of the coolant COO are provided in the liquid pipe LP1-2 connecting between the first tank 51 and the first pump 61. The coolant thermometer (unillustrated) and the coolant flowmeter (unillustrated) provided in the liquid pipe LP1-2 measure the temperature T5 and the flow rate w5 of the coolant COO flowing through the liquid pipe LP1-2, in accordance with an instruction provided by the control unit 80.

Another measurement method of Qf will be further described. At this time, a fan (unillustrated) supplying cooling air for cooling the first condensation unit 21 is provided close to the first condensation unit 21. For example, the first condensation unit 21 is a radiator and is configured to allow cooling air to pass from the side on which the fan is provided to the opposite side of where the fan is provided, or in a reverse direction. Furthermore, thermometers (unillustrated) are provided close to the first condensation unit 21 and also on the inlet side and the outlet side of the air passing through the first condensation unit 21. The thermometers measure inlet-side temperature Ta and outlet-side temperature Tb of the air passing through the first condensation unit 21, in accordance with an instruction provided by the control unit 80. The control unit 80 also detects an airflow volume of the fan. At this time, an airflow meter is provided close to the fan, and the control unit 80 detects a measured value of the airflow meter as an airflow volume of the fan. Alternatively, by previously storing a table describing a relation between an airflow volume of the fan and voltage of the fan in a storage unit (unillustrated), the control unit 80 can detect an airflow volume of the fan by acquiring voltage of the fan, without providing an airflow meter.

In the another measurement method of Qf, denoting an airflow volume of the fan supplying cooling air for cooling the first condensation unit 21 as F (m³/s), a temperature difference between the inlet-side temperature Ta of air passing through the first condensation unit 21 and the outlet-side temperature Tb of the air as ΔT (° C.) (=an absolute value of Ta−Tb), the specific heat of air as c (J/(kg·° C.), and the density of air as ρ (kg/m³), a cooling amount Qf (W) in the free-cooling refrigeration cycle can be roughly estimated according to the following equation 6.

$$Qf \approx c \times \rho \times F \times \Delta T \quad \text{(equation 6)}$$

Returning to FIG. 2, next, the control unit 80 measures a heat value Qall that needs to be cooled by the cooling device 100 (S22). Qall is also a heat value of the heat-generating body H. For example, when the heat-generating body H is a server device in a data center, Qall corresponds to power consumption of the server device. When a heat value flowing in from a wall surface of the data center can be measured, a value acquired by adding the heat value to the power consumption of the server device may be assumed as Qall.

Next, the control unit 80 measures a heat value Qc that needs to be cooled by the compression refrigeration cycle, in accordance with the following equation 7 (S23).

$$Qc = Qall - Qf \quad \text{(equation 7)}$$

Qc corresponds to a differential heat value being a heat value acquired by subtracting the cooling amount Qf by the free-cooling refrigeration cycle from the heat value Qall of the heat-generating body H.

Next, the control unit 80 measures a cooling amount Qc' of the compression refrigeration cycle (S24). A coolant thermometer (unillustrated) and a coolant flowmeter (unillustrated) for measuring temperature and a flow rate of a coolant COO are provided in the liquid pipe LP2-1 connecting between the second condensation unit 22 and the expansion valve 40. The coolant thermometer (unillustrated) and the coolant flowmeter (unillustrated) provided in the liquid pipe LP2-1 measure temperature T6 and a flow rate w6 of a coolant COO flowing through the liquid pipe LP2-1, in accordance with an instruction provided by the control unit 80.

Denoting a cooling amount of a coolant COO per unit mass at the specific temperature T6 as $\gamma$ (J/kg) and a flow rate of the coolant COO flowing through the liquid pipe LP2-1 as w6 (kg/s), the cooling amount Qc' (W) of the compression refrigeration cycle can be roughly estimated according to the following equation 8.

$$Qc' = \gamma \times w6 \qquad \text{(equation 8)}$$

Note that $\gamma$ is stored in a storage unit (unillustrated) similarly to ß. Specifically, while $\gamma$ varies with the temperature of the coolant COO, the storage unit stores data of $\gamma$ for each temperature. The control unit 80 calculates Qc' by multiplying $\gamma$ stored in the storage unit by a measured value of w6, according to equation 8.

The temperature of a coolant COO flowing through the pipe LP2-3 may be denoted as the specific temperature T6, and a flow rate of the coolant COO flowing through the liquid pipe LP2-3 may be denoted as w6. In this case, a coolant thermometer (unillustrated) and a coolant flowmeter (unillustrated) measuring temperature and a flow rate of the coolant COO are provided in the liquid pipe LP2-3 connecting between the second tank 52 and the second pump 62. The coolant thermometer (unillustrated) and the coolant flowmeter (unillustrated) provided in the liquid pipe LP2-3 measure the temperature T6 and the flow rate w6 of the coolant COO flowing through the liquid pipe LP2-3, in accordance with an instruction provided by the control unit 80.

Next, the control unit 80 compares the heat value Qc that needs to be cooled by the compression refrigeration cycle with the current cooling amount Qc' of the compression refrigeration cycle (S25). When Qc is determined to be greater than Qc' by the control unit 80 as a result of the comparison (S25, Yes), the control unit 80 determines that Qc' is insufficient and performs control of lowering the pressure P2 inside the second evaporation unit 12 (S26).

Specifically, the control unit 80 outputs, to the compressor 30, an instruction to raise a rotation rate of a motor in the compressor 30. Then, the compressor 30 raises the rotation rate of the motor in the compressor 30 in accordance with the instruction provided by the control unit 80. Consequently, an air intake of the compressor 30 increases, the pressure inside the vapor pipe VP2-1 decreases, and the pressure inside the second evaporation unit 12 connected to the vapor pipe VP2-1 also decreases.

The control unit 80 may output, to the expansion valve 40 instead of the compressor 30, an instruction to decrease a degree of opening of the expansion valve 40. Then, the expansion valve 40 decreases the degree of opening in accordance with the instruction provided by the control unit 80. Consequently, an amount of the liquid-phase coolant LP-COO flowing into the second evaporation unit 12 decreases, and the pressure inside the second evaporation unit 12 connected to the vapor pipe VP2-1 also decreases.

Alternatively, the control unit 80 may simultaneously control both the compressor 30 and the expansion valve 40, as described above. Specifically, the control unit 80 outputs, to the compressor 30, an instruction to raise the rotation rate of the motor in the compressor 30 and also outputs, to the expansion valve 40, an instruction to decrease the degree of opening of the expansion valve 40. Then, the compressor 30 raises the rotation rate of the motor in the compressor 30 in accordance with the instruction provided by the control unit 80. Further, the expansion valve 40 decreases the degree of opening in accordance with the instruction provided by the control unit 80. Consequently, the pressure inside the second evaporation unit 12 connected to the vapor pipe VP2-1 can be decreased, similarly to the above.

When Qc is determined to be not greater than Qc' by the control unit 80 as a result of the comparison (S25, No), the control unit 80 determines that Qc' is in excess and performs control of raising the pressure P2 inside the second evaporation unit 12 (S27).

Specifically, the control unit 80 outputs, to the compressor 30, an instruction to lower the rotation rate of the motor in the compressor 30. Then, the compressor 30 lowers the rotation rate of the motor in the compressor 30 in accordance with the instruction provided by the control unit 80. Consequently, the air intake of the compressor 30 decreases, the pressure inside the vapor pipe VP2-1 increases, and the pressure inside the second evaporation unit 12 connected to the vapor pipe VP2-1 also increases.

The control unit 80 may output, to the expansion valve 40 instead of the compressor 30, an instruction to increase the degree of opening of the expansion valve 40. Then, the expansion valve 40 increases the degree of opening in accordance with the instruction provided by the control unit 80. Consequently, an amount of the liquid-phase coolant LP-COO flowing into the second evaporation unit 12 increases, and the pressure inside the second evaporation unit 12 connected to the vapor pipe VP2-1 also increases.

Alternatively, the control unit 80 may simultaneously control both the compressor 30 and the expansion valve 40, as described above. Specifically, the control unit 80 outputs, to the compressor 30, an instruction to lower the rotation rate of the motor in the compressor 30 and also outputs, to the expansion valve 40, an instruction to increase the degree of opening of the expansion valve 40. Then, the compressor 30 lowers the rotation rate of the motor in the compressor 30 in accordance with the instruction provided by the control unit 80. Further, the expansion valve 40 increases the degree of opening in accordance with the instruction provided by the control unit 80. Consequently, the pressure inside the second evaporation unit 12 connected to the vapor pipe VP2-1 can be increased, similarly to the above.

The above concludes the description of the control of the compressor 30 and the expansion valve 40.

Figure 3:
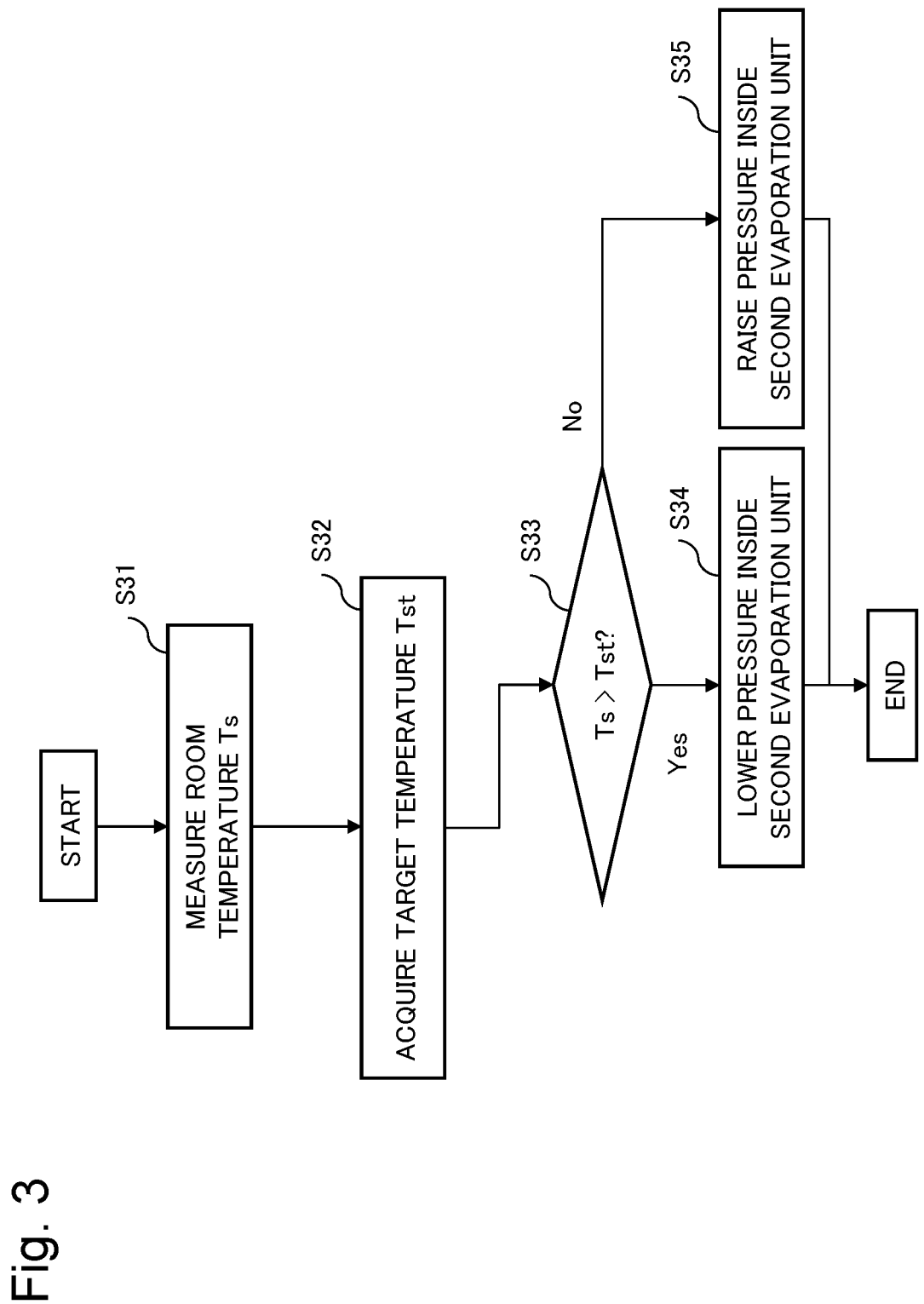
FIG. 3 is a flowchart for illustrating a modified example of the control of the compressor and the expansion valve.

Next, a modified example of the control of the compressor 30 and the expansion valve 40 will be described. FIG. 3 is a flowchart for illustrating a modified example of the control of the compressor 30 and the expansion valve 40.

As illustrated in FIG. 3, the control unit 80 detects the room temperature Ts inside the server room (S31). Ts denotes the temperature around the heat-generating body H. At least the first evaporation unit 11, the second evaporation unit 12, and the heat-generating body H (such as a server device) are provided inside the server room. A thermometer (unillustrated) for measuring Ts is provided inside the server room. For example, the thermometer is placed at a position being around the heat-generating body H and not being directly hit by exhaust heat of the heat-generating body H.

The control unit 80 outputs an instruction to measure Ts to the thermometer. The thermometer measures Ts in accordance with the instruction provided by the control unit 80. Then, the control unit 80 acquires the measured value of Ts from the thermometer. Thus, the control unit 80 detects the room temperature Ts inside the server room.

Next, the control unit 80 acquires a target temperature Tst (S32). The target temperature Tst is preset by a user of the cooling device 100. Further, for example, the target temperature Tst is registered in a storage unit (unillustrated). Basically, once being set, the target temperature Tst is rarely changed. For example, the target temperature Tst is set based on a specification of a server in the data center (such as 25° C.).

Next, the control unit 80 compares the measured value Ts of the room temperature with the target temperature Tst (S33).

When Ts is determined to be greater than Tst by the control unit 80 as a result of the comparison, the control unit 80 performs control of lowering the pressure P2 inside the second evaporation unit 12 (S34). The control method of lowering the pressure P2 inside the second evaporation unit 12 is as described by use of FIG. 2.

When Ts is determined to be not greater than Tst by the control unit 80 as a result of the comparison, the control unit 80 performs control of raising the pressure P2 inside the second evaporation unit 12 (S35). The control method of raising the pressure P2 inside the second evaporation unit 12 is as described by use of FIG. 2.

The above concludes the description of the modified example of the control of the compressor 30 and the expansion valve 40.

As described above, the cooling device 100 according to the first example embodiment of the present invention includes the first evaporation unit 11, the second evaporation unit 12, the first condensation unit 21, the second condensation unit 22, the common pipe CP, the compressor 30, the expansion valve 40, the first valve 71, and the second valve 72. Each of the first evaporation unit 11 and the second evaporation unit 12 receives heat of the heat-generating body H, evaporates an internally stored liquid-phase coolant LP-COO by the heat of the heat-generating body H, and causes a gas-phase coolant GP-COO to flow out. The first condensation unit 21 is connected to the first evaporation unit 11. The first condensation unit 21 condenses a gas-phase coolant GP-COO flowing out from the first evaporation unit 11 and causes a liquid-phase coolant GP-COO to flow out. The second condensation unit 22 is connected to the second evaporation unit 12. The second condensation unit 22 condenses a gas-phase coolant GP-COO flowing out from the second evaporation unit 12 and causes a liquid-phase coolant LP-COO to flow out. The common pipe CP is provided between the first evaporation unit 11 and the first condensation unit 21 and also between the second evaporation unit 12 and the second condensation unit 22. The common pipe CP causes a liquid-phase coolant LP-COO flowing out from the first condensation unit 21 and a liquid-phase coolant LP-COO flowing out from the second condensation unit 22 to join. The compressor 30 is connected to the second evaporation unit 12 and the second condensation unit 22. The compressor 30 compresses a gas-phase coolant GP-COO flowing out from the second evaporation unit 12. The expansion valve 40 is connected to the second condensation unit 22 and the common pipe CP. The expansion valve 40 expands a liquid-phase coolant LP-COO flowing out from the second condensation unit 22. The first valve 71 is connected to the first evaporation unit 11 and the common pipe CP. The first valve 71 adjusts an amount of liquid-phase coolant LP-COO flowing into the first evaporation unit 11. The second valve 72 is connected to the second evaporation unit 12 and the common pipe CP. The second valve 72 adjusts an amount of liquid-phase coolant LP-COO flowing into the second evaporation unit 12. The pressure P0 inside the common pipe CP is greater than the pressure P1 inside the first evaporation unit 11 and the pressure P2 inside the second evaporation unit 12.

Thus, by providing the common pipe CP, the cooling device 100 causes a liquid-phase coolant LP-COO flowing out from the first condensation unit 21 and a liquid-phase coolant LP-COO flowing out from the second condensation unit 22 to join. Consequently, compared with the cooling device described in PTL 1, the cooling device 100 can shorten a piping length of liquid pipes in particular. Consequently, the cooling device 100 can reduce a piping cost and a pipe installation cost compared with the cooling device described in PTL 1.

The first condensation unit 21 and the second condensation unit 22 in the cooling device 100 according to the first example embodiment of the present invention are respectively provided on the upper side of the first evaporation unit 11 and the second evaporation unit 12 in the vertical direction and also at positions making the pressure P0 inside the common pipe CP greater than the pressure P1 inside the first evaporation unit 11 and the pressure P2 inside the second evaporation unit 12.

Thus, the first condensation unit 21 and the second condensation unit 22 are respectively provided on the upper side of the first evaporation unit 11 and the second evaporation unit 12 in the vertical direction. Consequently, flow speeds of liquid-phase coolants LP-COO in the common pipe CP can be accelerated, the liquid-phase coolants LP-COO falling from the first condensation unit 21 and the second condensation unit 22 to the first evaporation unit 11 and the second evaporation unit 12, respectively, and the pressure inside the common pipe CP can be increased. Consequently, by placing the first condensation unit 21 and the second condensation unit 22 on the upper side of the first evaporation unit 11 and the second evaporation unit 12 in the vertical direction, respectively, the pressure P0 inside the common pipe CP can be easily set to be greater than the pressure P1 inside the first evaporation unit 11 and the pressure P2 inside the second evaporation unit 12.

The cooling device 100 according to the first example embodiment of the present invention further includes the first pump 61 and the second pump 62. The first pump 61 is provided between the first condensation unit 21 and the common pipe CP. The first pump 61 conveys a liquid-phase coolant LP-COO flowing out from the first condensation unit 21 to the common pipe CP in such a way that the pressure inside the common pipe CP is greater than the pressure inside the first evaporation unit 11 and the pressure inside the second evaporation unit 12. The second pump 62 is provided between the second condensation unit 22 and the common pipe CP. The second pump 62 conveys a liquid-phase coolant LP-COO flowing out from the second condensation unit 22 in such a way that the pressure inside the common pipe CP is greater than the pressure inside the first evaporation unit 11 and the pressure inside the second evaporation unit 12.

Thus, liquid-phase coolants LP-COO are forcibly caused to flow into the common pipe CP by use of the first pump 61 and the second pump 62, and therefore the pressure inside the common pipe CP can be more reliably set to be greater than the pressure inside the first evaporation unit 11 and the pressure inside the second evaporation unit 12.

The cooling device 100 according to the first example embodiment of the present invention further includes the first tank 51. The first tank 51 is provided between the first condensation unit 21 and the common pipe CP and also on the upper side of the first pump 61 in the vertical direction. The first tank 51 stores a liquid-phase coolant LP-COO caused to flow out by the first condensation unit 21.

Thus, by providing the first tank 51, a liquid-phase coolant LP-COO generated by the first condensation unit 21 can be temporarily stored, and therefore a flow rate of a liquid-phase coolant LP-COO flowing into the first pump 61 can be adjusted. Further, even when a gas-phase coolant GP-COO mixed with the liquid-phase coolant LP-COO generated by the first condensation unit 21 flows into the first tank 51, the liquid-phase coolant LP-COO moves downward in the vertical direction in the first tank 51, and the gas-phase coolant GP-COO moves upward in the vertical direction in the first tank 51. Accordingly, the liquid-phase coolant LP-COO and the gas-phase coolant GP-COO can be separated in the first tank 51.

The first pump 61 in the cooling device 100 according to the first example embodiment of the present invention conveys a liquid-phase coolant LP-COO flowing out from the first condensation unit 21 to the common pipe CP according to a surface level of a liquid-phase coolant LP-COO in the first tank 51.

Consequently, occurrence of a big difference between an amount of liquid-phase coolant LP-COO evaporated in the first evaporation unit 11 and an amount of liquid-phase coolant LP-COO conveyed by the first pump 61 can be prevented. Accordingly, entry of the first tank 51 into the exhausted state or the flooded state can be avoided. By avoiding entry of the first tank 51 into the exhausted state, idling of the motor in the first pump 61 can be suppressed, and degradation in the cooling function of the cooling device 100 can be suppressed. Further, by avoiding entry of the first tank 51 into the flooded state, increase in an amount of liquid-phase coolant LP-COO in the first condensation unit 21 can be suppressed, and inflow of the liquid-phase coolant LP-COO into the vapor pipe VP1-1 can also be suppressed. Consequently, degradation in the cooling function of the cooling device 100 can be suppressed.

The cooling device 100 according to the first example embodiment of the present invention further includes the second tank 52. The second tank 52 is provided between the second condensation unit 22 and the common pipe CP and also on the upper side of the second pump 62 in the vertical direction. The second tank 52 stores a liquid-phase coolant LP-COO caused to flow out by the second condensation unit 22.

Thus, by providing the second tank 52, a liquid-phase coolant LP-COO generated by the second condensation unit 22 can be temporarily stored, and therefore a flow rate of a liquid-phase coolant LP-COO flowing into the second pump 62 can be adjusted. Further, even when a gas-phase coolant GP-COO mixed with the liquid-phase coolant LP-COO generated by the second condensation unit 22 flows into the second tank 52, the liquid-phase coolant LP-COO moves downward in the vertical direction in the second tank 52, and the gas-phase coolant GP-COO moves upward in the vertical direction in the second tank 52. Accordingly, the liquid-phase coolant LP-COO and the gas-phase coolant GP-COO can be separated in the second tank 52.

The second pump 62 in the cooling device 100 according to the first example embodiment of the present invention conveys a liquid-phase coolant LP-COO flowing out from the second condensation unit 22 to the common pipe CP according to a surface level of a liquid-phase coolant LP-COO in the second tank 52.

Consequently, occurrence of a big difference between an amount of liquid-phase coolant LP-COO evaporated in the second evaporation unit 12 and an amount of liquid-phase coolant LP-COO conveyed by the second pump 62 can be prevented. Accordingly, entry of the second tank 52 into the exhausted state or the flooded state can be avoided. By avoiding entry of the second tank 52 into the exhausted state, idling of the motor in the second pump 62 can be suppressed, and degradation in the cooling function of the cooling device 100 can be suppressed. Further, by avoiding entry of the second tank 52 into the flooded state, increase in an amount of liquid-phase coolant LP-COO in the second condensation unit 22 can be suppressed, and inflow of the liquid-phase coolant LP-COO into the vapor pipe VP2-1 can also be suppressed. Consequently, degradation in the cooling function of the cooling device 100 can be suppressed.

The cooling device 100 according to the first example embodiment of the present invention further includes the bypass pipe BP. The bypass pipe BP guides a gas-phase coolant GP-COO contained in the second tank 52 to the compressor 30. Consequently, collection of the gas-phase coolant GP-COO in the second tank 52 can be suppressed.

The cooling device 100 according to the first example embodiment of the present invention configures the free-cooling refrigeration cycle and the compression refrigeration cycle. The free-cooling refrigeration cycle circulates a liquid-phase coolant LP-COO or a gas-phase coolant GP-COO among the first evaporation unit 11, the first condensation unit 21, and the common pipe CP. The compression refrigeration cycle circulates a liquid-phase coolant LP-COO or a gas-phase coolant GP-COO among the second evaporation unit 12, the second condensation unit 22, the compressor 30, the expansion valve 40, and the common pipe CP. The cooling device 100 further includes the control unit 80. The control unit 80 controls either one or both of the compressor 30 and the expansion valve 40, based on the differential heat value $Q_c$ being a heat value acquired by subtracting the cooling amount $Q_f$ by the free-cooling refrigeration cycle from the heat value $Q_{all}$ of the heat-generating body H.

Thus, the control unit 80 controls either one or both of the compressor 30 and the expansion valve 40, based on the differential heat value $Q_c$ ($=Q_{all}-Q_f$) being a heat value acquired by subtracting the cooling amount $Q_f$ by the free-cooling refrigeration cycle from the heat value $Q_{all}$ of the heat-generating body H. In other words, the control unit 80 controls either one or both of the compressor 30 and the expansion valve 40 in the compression refrigeration cycle, according to the differential heat value $Q_c$ being a heat value that cannot be cooled by the free-cooling refrigeration cycle in the heat value $Q_{all}$ of the heat-generating body H. Consequently, either one or both of the compressor 30 and the expansion valve 40 in the compression refrigeration cycle can be controlled with minimally required electric power, according to $Q_c$.

The cooling device 100 according to the first example embodiment of the present invention further includes the control unit 80. The control unit 80 controls either one or both of the compressor 30 and the expansion valve 40, based on the temperature $T_s$ around the heat-generating body H. Consequently, the control unit 80 can control either one or both of the compressor 30 and the expansion valve 40 more simply than controlling based on the differential heat value Qc (=Qall−Qf) being a heat value acquired by subtracting the cooling amount Qf by the free-cooling refrigeration cycle from the heat value Qall of the heat-generating body H.

The first valve 71 in the cooling device 100 according to the first example embodiment of the present invention adjusts an amount of liquid-phase coolant LP-COO flowing into the first evaporation unit 11, based on the heat recovery amount Q1 of the first evaporation unit 11. The second valve 72 adjusts an amount of liquid-phase coolant LP-COO flowing into the second evaporation unit 12, based on the heat recovery amount Q2 of the second evaporation unit 12.

Consequently, a proper amount of liquid-phase coolant LP-COO can be supplied to each of the first evaporation unit 11 and the second evaporation unit 12. Further, by keeping the heat recovery amount Q1 of the first evaporation unit 11 at the threshold value Qo1 (a constant value), the flow rate w1 of a coolant COO flowing into the first evaporation unit 11 is adjusted, and mixing of a liquid-phase coolant LP-COO into the vapor pipe VP1 is suppressed. Consequently, the cooling device 100 can stabilize the pressure inside the vapor pipe VP1, reduce pressure loss between the first evaporation unit 11 and the first condensation unit 21, and suppress reduction in the heat recovery amount Q1 of the first evaporation unit 11. Similarly, by keeping the heat recovery amount Q2 of the second evaporation unit 12 at the threshold value Qo2 (a constant value), the flow rate w2 of a coolant COO flowing into the second evaporation unit 12 is adjusted, and mixing of a liquid-phase coolant LP-COO into the vapor pipe VP2-1 is suppressed. Consequently, the cooling device 100 can stabilize the pressure inside the vapor pipe VP2-1, reduce pressure loss between the second evaporation unit 12 and the condensation unit 22, and suppress reduction in the heat recovery amount Q2 of the second evaporation unit 12.

The cooling device 100 according to the first example embodiment of the present invention further includes the first vapor pipe VP1 and the second vapor pipe VP2. The first vapor pipe VP1 is for connecting the first evaporation unit 11 and the first condensation unit 21, and causing a gas-phase coolant GP-COO to flow from the first evaporation unit 11 to the first condensation unit 21. The second vapor pipe VP2-1 is for connecting the second evaporation unit 12 and the second condensation unit 22, and causing a gas-phase coolant GP-COO to flow from the second evaporation unit 12 to the second condensation unit 22. The first valve 71 adjusts an amount of liquid-phase coolant LP-COO flowing into the first evaporation unit 11, based on the temperature inside the first vapor pipe VP1. The second valve 72 adjusts an amount of liquid-phase coolant LP-COO flowing into the second evaporation unit 12, based on the temperature inside the second vapor pipe VP2-1.

Consequently, a proper amount of liquid-phase coolant LP-COO can be supplied to each of the first evaporation unit 11 and the second evaporation unit 12.

A control method according to the first example embodiment of the present invention is a control method for the cooling device 100 including the first evaporation unit 11, the second evaporation unit 12, the first condensation unit 21, the second condensation unit 22, the common pipe CP, the compressor 30, the expansion valve 40, the first valve 71, and the second valve 72. In the control method, the pressure P0 inside the common pipe CP is set to be greater than the pressure P1 inside the first evaporation unit 11 and the pressure P2 inside the second evaporation unit 12. It is assumed in the control method that the free-cooling refrigeration cycle and the compression refrigeration cycle are configured. The free-cooling refrigeration cycle circulates a liquid-phase coolant LP-COO or a gas-phase coolant GP-COO among the first evaporation unit 11, the first condensation unit 21, and the common pipe CP. The compression refrigeration cycle circulates a liquid-phase coolant LP-COO or a gas-phase coolant GP-COO among the second evaporation unit 12, the second condensation unit 22, the compressor 30, the expansion valve 40, and the common pipe CP. Then, the control method includes control processing of controlling either one or both of the compressor 30 and the expansion valve 40, based on the differential heat value Qc being a heat value acquired by subtracting the cooling amount Qf by the free-cooling refrigeration cycle from the heat value Qall of the heat-generating body H.

Such a control method can also provide an effect similar to the effect of the aforementioned cooling device 100.

A control program according to the present invention is a control program for the cooling device 100 including the first evaporation unit 11, the second evaporation unit 12, the first condensation unit 21, the second condensation unit 22, the common pipe CP, the compressor 30, the expansion valve 40, the first valve 71, and the second valve 72. It is assumed in the control program that the free-cooling refrigeration cycle and the compression refrigeration cycle are configured. The free-cooling refrigeration cycle circulates a liquid-phase coolant LP-COO or a gas-phase coolant GP-COO among the first evaporation unit 11, the first condensation unit 21, and the common pipe CP. The compression refrigeration cycle circulates a liquid-phase coolant LP-COO or a gas-phase coolant GP-COO among the second evaporation unit 12, the second condensation unit 22, the compressor 30, the expansion valve 40, and the common pipe CP. Then, the control program includes control processing of controlling either one or both of the compressor 30 and the expansion valve 40, based on the differential heat value Qc being a heat value acquired by subtracting the cooling amount Qf by the free-cooling refrigeration cycle from the heat value Qall of the heat-generating body H.

Such a control program can also provide an effect similar to the effect of the aforementioned cooling device 100.

A storage medium according to the present invention is a storage medium storing a control program for the cooling device 100 including the first evaporation unit 11, the second evaporation unit 12, the first condensation unit 21, the second condensation unit 22, the common pipe CP, the compressor 30, the expansion valve 40, the first valve 71, and the second valve 72. In the storage medium, the pressure P0 inside the common pipe CP is set to be greater than the pressure P1 inside the first evaporation unit 11 and the pressure P2 inside the second evaporation unit 12. It is assumed in the storage medium that the free-cooling refrigeration cycle and the compression refrigeration cycle are configured. The free-cooling refrigeration cycle circulates a liquid-phase coolant LP-COO or a gas-phase coolant GP-COO among the first evaporation unit 11, the first condensation unit 21, and the common pipe CP. The compression refrigeration cycle circulates a liquid-phase coolant LP-COO or a gas-phase coolant GP-COO among the second evaporation unit 12, the second condensation unit 22, the compressor 30, the expansion valve 40 and the common pipe CP. Then, the storage medium stores the control program including control processing of controlling either one or both of the compressor 30 and the expansion valve 40, based on the differential heat value Qc being a heat value acquired by subtracting the cooling amount Qf by the free-cooling refrigeration cycle from the heat value Qall of the heat-generating body H.

Such a storage medium can also provide an effect similar to the effect of the aforementioned cooling device 100.

Second Example Embodiment

Figure 4:
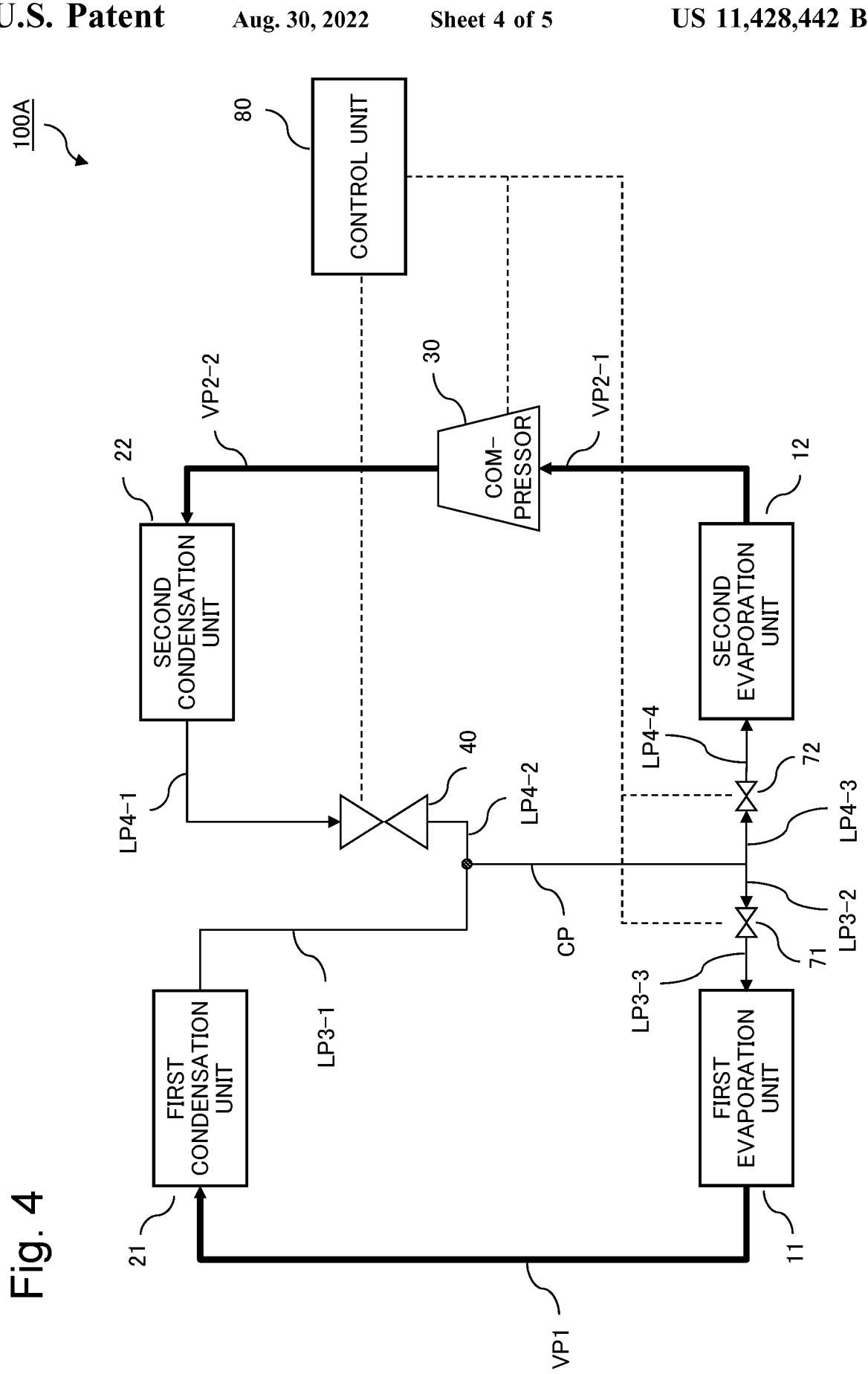
FIG. 4 is a schematic diagram illustrating a configuration of a cooling device according to a second example embodiment of the present invention.

A cooling device 100A according to a second example embodiment of the present invention will be described based on diagrams. FIG. 4 is a schematic diagram illustrating a configuration of the cooling device 100A. In FIG. 4, a component equivalent to each component illustrated in FIG. 1 is given a sign equivalent to the sign indicated in FIG. 1. The cooling device 100 according to the first example embodiment is an example of the cooling device 100A according to the present example embodiment.

The cooling device 100A cools a heat-generating body H (unillustrated in FIG. 4). As illustrated in FIG. 1, the heat-generating body H is placed close to a first evaporation unit 11 and a second evaporation unit. However, the first evaporation unit 11 and the second evaporation unit 12 do not necessarily need to be provided close to the heat-generating body H as long as the units can receive heat of the heat-generating body H.

As illustrated in FIG. 4, the cooling device 100A includes the first evaporation unit 11, the second evaporation unit 12, a first condensation unit 21, a second condensation unit 22, a compressor 30, an expansion valve 40, a first valve 71, a second valve 72, and a control unit 80.

The cooling device 100A further includes a first vapor pipe VP1 and second vapor pipes VP2-1 and VP2-2. The cooling device 100A further includes first liquid pipes LP3-1, LP3-2, and LP3-3 and second liquid pipes LP4-1, LP4-2, LP4-3, and LP4-4. The cooling device 100A further includes a bypass pipe BP and a common pipe CP.

When the second vapor pipes VP2-1 and VP2-2 do not need to be distinguished from each another, the pipes may be referred to as second vapor pipes VP2. Similarly, when the first liquid pipes LP3-1, LP3-2, and LP3-3 do not need to be distinguished from one another, the pipes may be referred to as first liquid pipes LP3. Furthermore, when the second liquid pipes LP4-1, LP4-2, LP4-3, and LP4-4 do not need to be distinguished from one another, the pipes may be referred to as second liquid pipes LP4. VP1, VP2, LP3, and LP4 are not essential components in the present example embodiment.

The cooling device 100 and the cooling device 100A will be compared. The cooling device 100 includes the first tank 51, the second tank 52, the first pump 61, and the second pump 62. On the other hand, the cooling device 100A does not include the components. Further, the first liquid pipes LP1 include five pipes in the cooling device 100. On the other hand, the first liquid pipes LP3 include three pipes in the cooling device 100A. The second liquid pipes LP2 include six pipes in the cooling device 100. On the other hand, the second liquid pipes LP4 include four pipes in the cooling device 100A.

The cooling device 100A circulates a coolant COO between the first evaporation unit 11 and the first condensation unit 21, and also circulates a coolant COO among the first evaporation unit 11, the first condensation unit 21, the compressor 30, and the expansion valve 40, similarly to the cooling device 100.

A system circulating a coolant COO between the first evaporation unit 11 and the first condensation unit 21 at least through the common pipe CP is referred to as a free-cooling refrigeration cycle. A system circulating a coolant COO among the second evaporation unit 12, the second condensation unit 22, the compressor 30, and the expansion valve 40 through at least the common pipe CP is referred to as a compression refrigeration cycle.

Each component of the cooling device 100A will be described below.

The first evaporation unit 11 is provided close to the heat-generating body H (unillustrated in FIG. 4). The first evaporation unit 11 is connected to the first condensation unit 21 through the first vapor pipe VP1. The first evaporation unit 11 is further connected to the common pipe CP through the first liquid pipes LP3-2 and 3-3, and the first valve 71. The first evaporation unit 11 internally stores a coolant COO. The first evaporation unit 11 receives heat of the heat-generating body H, evaporates the internally stored liquid-phase coolant LP-COO by the heat of the heat-generating body H, and causes a gas-phase coolant GP-COO to flow out to the first condensation unit 21. The first evaporation unit 11 has been described to be provided close to the heat-generating body H in the above description. On the other hand, the first evaporation unit 11 does not necessarily need to be provided close to the heat-generating body H as long as the unit can receive heat of the heat-generating body H.

The second evaporation unit 12 is provided close to the heat-generating body H (unillustrated in FIG. 4), similarly to the first evaporation unit 11. The second evaporation unit 12 is connected to the second condensation unit 22 through the compressor 30 and the second vapor pipes VP2-1 and 2-2. The second evaporation unit 12 is further connected to the common pipe CP through the second liquid pipes LP4-3 and 4-4, and the second valve 72. The second evaporation unit 12 internally stores a coolant COO. The second evaporation unit 12 receives heat of the heat-generating body H, evaporates the internally stored liquid-phase coolant LP-COO by the heat of the heat-generating body H, and causes a gas-phase coolant GP-COO to flow out to the second condensation unit 22 through the compressor 30. The second evaporation unit 12 has been described to be provided close to the heat-generating body H in the above description. On the other hand, the second evaporation unit 12 does not necessarily need to be provided close to the heat-generating body H as long as the unit can receive heat of the heat-generating body H.

The first condensation unit 21 is connected to the first evaporation unit 11 through the first vapor pipe VP1. The first condensation unit 21 is further connected to the common pipe CP through the first liquid pipe LP3-1. The first condensation unit 21 condenses a gas-phase coolant GP-COO flowing out from the first evaporation unit 11 and causes a liquid-phase coolant LP-COO to flow out.

The second condensation unit 22 is connected to the second evaporation unit 12 through the compressor 30 and the second vapor pipes VP2-1 and 2-2. The second condensation unit 22 is further connected to the common pipe CP through the expansion valve 40 and the second liquid pipes LP4-1 and 4-2. The second condensation unit 22 condenses a gas-phase coolant GP-COO flowing out from the second evaporation unit 12 and causes a liquid-phase coolant LP-COO to flow out.

The compressor 30 is connected to the second evaporation unit 12 through the second vapor pipe VP2-1. The compressor 30 is further connected to the second condensation unit 22 through the second vapor pipe VP2-2. The compressor 30 compresses a gas-phase coolant GP-COO flowing out from the second evaporation unit 12. Then, the compressor 30 causes the gas-phase coolant GP-COO compressed by the compressor 30 to flow out to the second condensation unit 22. The compressor 30 operates in accordance with an instruction provided by the control unit 80.

The expansion valve 40 is connected to the second condensation unit 22 through the second liquid pipe VP4-1. The expansion valve 40 is further connected to the common pipe CP through the second liquid pipe LP4-2. The expansion valve 40 expands a liquid-phase coolant LP-COO flowing out from the second condensation unit 22. The expansion valve 40 operates in accordance with an instruction provided by the control unit 80.

The first valve 71 is connected to the first evaporation unit 11 through the first liquid pipe LP3-3. The first valve 71 is further connected to the common pipe CP through the first liquid pipe LP3-2. The first valve 71 is provided between the first evaporation unit 11 and the common pipe CP. The first valve 71 adjusts an amount of liquid-phase coolant LP-COO flowing into the first evaporation unit 11. The first valve 71 operates in accordance with an instruction provided by the control unit 80. For example, in accordance with an instruction provided by the control unit 80, the first valve 71 adjusts an amount of coolant COO flowing into the first evaporation unit 11, based on a heat recovery amount Q1 of the first evaporation unit 11. A specific operation of the first valve 71 will be described in detail in a description of operation to be described later.

The second valve 72 is connected to the second evaporation unit 12 through the second liquid pipe LP4-4. The second valve 72 is further connected to the common pipe CP through the second liquid pipe LP4-3. The second valve 72 is provided between the second evaporation unit 12 and the common pipe CP. The second valve 72 adjusts an amount of liquid-phase coolant LP-COO flowing into the second evaporation unit 12. The second valve 72 operates in accordance with an instruction provided by the control unit 80. For example, in accordance with an instruction provided by the control unit 80, the second valve 72 adjusts an amount of coolant COO flowing into the second evaporation unit 12, based on a heat recovery amount Q2 of the second evaporation unit 12. A specific operation of the second valve 72 will be described in detail in the description of operation to be described later.

The control unit 80 is communicably connected to at least the compressor 30, the expansion valve 40, the first valve 71, and the second valve 72, in a wired or wireless manner. The control unit 80 controls the entire cooling device 100A. The control unit 80 particularly controls the compressor 30, the expansion valve 40, the first valve 71, and the second valve 72.

Next, a piping relation will be described. The vapor pipe VP1 connects to the first evaporation unit 11 and the first condensation unit 21. The liquid pipe LP3-1 connects between the first condensation unit 21 and the common pipe CP. The liquid pipes LP3-2 and 3-3 connect between the common pipe CP and the first evaporation unit 11 through the first valve 71. The vapor pipe VP2-1 connects between the second evaporation unit 12 and the compressor 30. The vapor pipe VP2-2 connects between the compressor 30 and the second condensation unit 22. The liquid pipe LP4-1 connects between the second condensation unit 22 and the expansion valve 40. The liquid pipe LP4-2 connects between the expansion valve 40 and the common pipe CP. The liquid pipes LP4-3 and 4-4 connect between the common pipe CP and the second evaporation unit 12 through the second valve 72. One end of the common pipe CP is connected to the liquid pipe LP3-1 and the liquid pipe LP4-2, and the other end of the common pipe CP is connected to the liquid pipe LP3-2 and the liquid pipe LP4-3.

Next, an operation of the cooling device 100A will be described. An operation of the cooling device 100A in the free-cooling refrigeration cycle and an operation of the cooling device 100A in the compression refrigeration cycle will be separately described. While the operation of the cooling device 100A in the free-cooling refrigeration cycle and the operation of the cooling device 100A in the compression refrigeration cycle will be separately described, the free-cooling refrigeration cycle and the compression refrigeration cycle actually operate simultaneously.

First, the operation of the cooling device 100A in the free-cooling refrigeration cycle will be described. As described above, the free-cooling refrigeration cycle is a system circulating a coolant COO between the first evaporation unit 11 and the first condensation unit 21 at least through the common pipe CP.

The first evaporation unit 11 receives heat of the heat-generating body H, evaporates an internally stored liquid-phase coolant LP-COO by the heat of the heat-generating body H, and causes a gas-phase coolant GP-COO to flow out to the first condensation unit 21 through the vapor pipe VP1. Consequently, the gas-phase coolant GP-COO flows into the first condensation unit 21.

Next, the first condensation unit 21 condenses the gas-phase coolant GP-COO flowing out from the first evaporation unit 11 and causes a liquid-phase coolant LP-COO to flow out.

The liquid-phase coolant LP-COO generated by the first condensation unit 21 flows into the common pipe CP through the liquid pipe LP3-1.

Part of the liquid-phase coolant LP-COO flowing through the common pipe CP flows into the first evaporation unit 11 through the first valve 71 and the first liquid pipes LP3-2 and 3-3, according to a degree of opening of the first valve 71.

As will be described in detail in a description of operation of the cooling device 100A in the compression refrigeration cycle, the remainder of the liquid-phase coolant LP-COO flowing through the common pipe CP flows into the second evaporation unit 12 through the second valve 72 and the second liquid pipes LP4-3 and 4-4, according to a degree of opening of the second valve 72.

Adjustment of the degree of opening of the first valve 71 is similar to the description in the first example embodiment. In other words, for example, in accordance with an instruction provided by the control unit 80, the first valve 71 adjusts an amount of coolant COO flowing into the first evaporation unit 11, based on the heat recovery amount Q1 of the first evaporation unit 11. Specifically, the control unit 80 calculates the heat recovery amount Q1 of the first evaporation unit 11 according to equation 1. Then, the control unit 80 compares the measured value of Q1 with a threshold value Qo1 of Q1 and performs control in such a way that Q1 approaches the threshold value Qo1.

As described above, under an instruction of the control unit 80, the first valve 71 adjusts the degree of opening of the first valve 71, based on the heat recovery amount Q1 of the first evaporation unit 11. By keeping the heat recovery amount Q1 of the first evaporation unit 11 at the threshold value Qo1 (a constant value), a flow rate w1 of a coolant COO flowing into the first evaporation unit 11 is adjusted, and mixing of a liquid-phase coolant LP-COO into the vapor pipe VP1 is suppressed. Consequently, the cooling device 100A can stabilize the pressure inside the vapor pipe VP1, reduce pressure loss between the first evaporation unit 11 and the first condensation unit 21, and suppress reduction in the heat recovery amount Q1 of the first evaporation unit 11.

Further, as described in the first example embodiment, for example, in accordance with an instruction provided by the control unit 80, the first valve 71 may also adjust an amount of coolant COO flowing into the first evaporation unit 11, based on a degree of superheat H1 of the first evaporation unit 11.

Next, the operation of the cooling device 100A in the compression refrigeration cycle will be described. As described above, the compression refrigeration cycle is a system circulating a coolant COO among the second evaporation unit 12, the second condensation unit 22, the compressor 30, and the expansion valve 40 through at least the common pipe CP.

The second evaporation unit 12 receives heat of the heat-generating body H, evaporates an internally stored liquid-phase coolant LP-COO by the heat of the heat-generating body H, and causes a gas-phase coolant GP-COO to flow out toward the compressor 30 through the vapor pipe VP2-1. Consequently, the gas-phase coolant GP-COO flows into the compressor 30.

The compressor 30 compresses the gas-phase coolant GP-COO flowing out from the second evaporation unit 12. Consequently, the pressure and the temperature of the gas-phase coolant GP-COO rise. Then, the compressor 30 causes the gas-phase coolant GP-COO compressed by the compressor 30 to flow out to the second condensation unit 22. Consequently, the gas-phase coolant GP-COO flows into the second condensation unit 22. Details of the operation of the compressor 30 will be described later.

Next, the second condensation unit 22 condenses the gas-phase coolant GP-COO flowing out from the compressor 30 and causes a liquid-phase coolant LP-COO to flow out.

The liquid-phase coolant LP-COO generated by the second condensation unit 22 flows into the expansion valve 40. The expansion valve 40 expands the liquid-phase coolant LP-COO flowing out from the second condensation unit 22. The liquid-phase coolant LP-COO expanded by the expansion valve 40 flows into the common pipe CP. Details of the operation of the expansion valve 40 will be described later.

As described above, part of the liquid-phase coolant LP-COO flowing through the common pipe CP flows into the first evaporation unit 11 through the first valve 71 and the first liquid pipes LP3-2 and 3-3, according to the degree of opening of the first valve 71. Then the remainder of the liquid-phase coolant LP-COO flowing through the common pipe CP flows into the second evaporation unit 12 through the second valve 72 and the second liquid pipes LP4-3 and 4-4, according to the degree of opening of the second valve 72.

Adjustment of the degree of opening of the second valve 72 is similar to the description in the first example embodiment. In other words, for example, in accordance with an instruction provided by the control unit 80, the second valve 72 adjusts an amount of coolant COO flowing into the second evaporation unit 12, based on the heat recovery amount Q2 of the second evaporation unit 12. Specifically, the control unit 80 calculates the heat recovery amount Q2 of the second evaporation unit 12 according to equation 3. Then, the control unit 80 compares the measured value of Q2 with a threshold value Qo2 of Q2 and performs control in such a way that Q2 approaches the threshold value Qo2.

As described above, under an instruction of the control unit 80, the second valve 72 adjusts the degree of opening of the second valve 72, based on the heat recovery amount Q2 of the second evaporation unit 12. By keeping the heat recovery amount Q2 of the second evaporation unit 12 at the threshold value Qo2 (a constant value), a flow rate w2 of a coolant COO flowing into the second evaporation unit 12 is adjusted, and mixing of a liquid-phase coolant LP-COO into the vapor pipe VP2-1 is suppressed. Consequently, the cooling device 100A can stabilize the pressure inside the vapor pipe VP2-1, reduce pressure loss between the second evaporation unit 12 and the second condensation unit 22, and suppress reduction in the heat recovery amount Q2 of the second evaporation unit 12.

Further, as described in the first example embodiment, for example, in accordance with an instruction provided by the control unit 80, the second valve 72 may also adjust an amount of coolant COO flowing into the second evaporation unit 12, based on a degree of superheat H2 of the second evaporation unit 12.

As described above, while the operation of the cooling device 100A in the free-cooling refrigeration cycle and the operation of the cooling device 100A in the compression refrigeration cycle have been separately described, the free-cooling refrigeration cycle and the compression refrigeration cycle actually operate simultaneously.

Next, control of the compressor 30 and the expansion valve 40 will be described.

Figure 5:
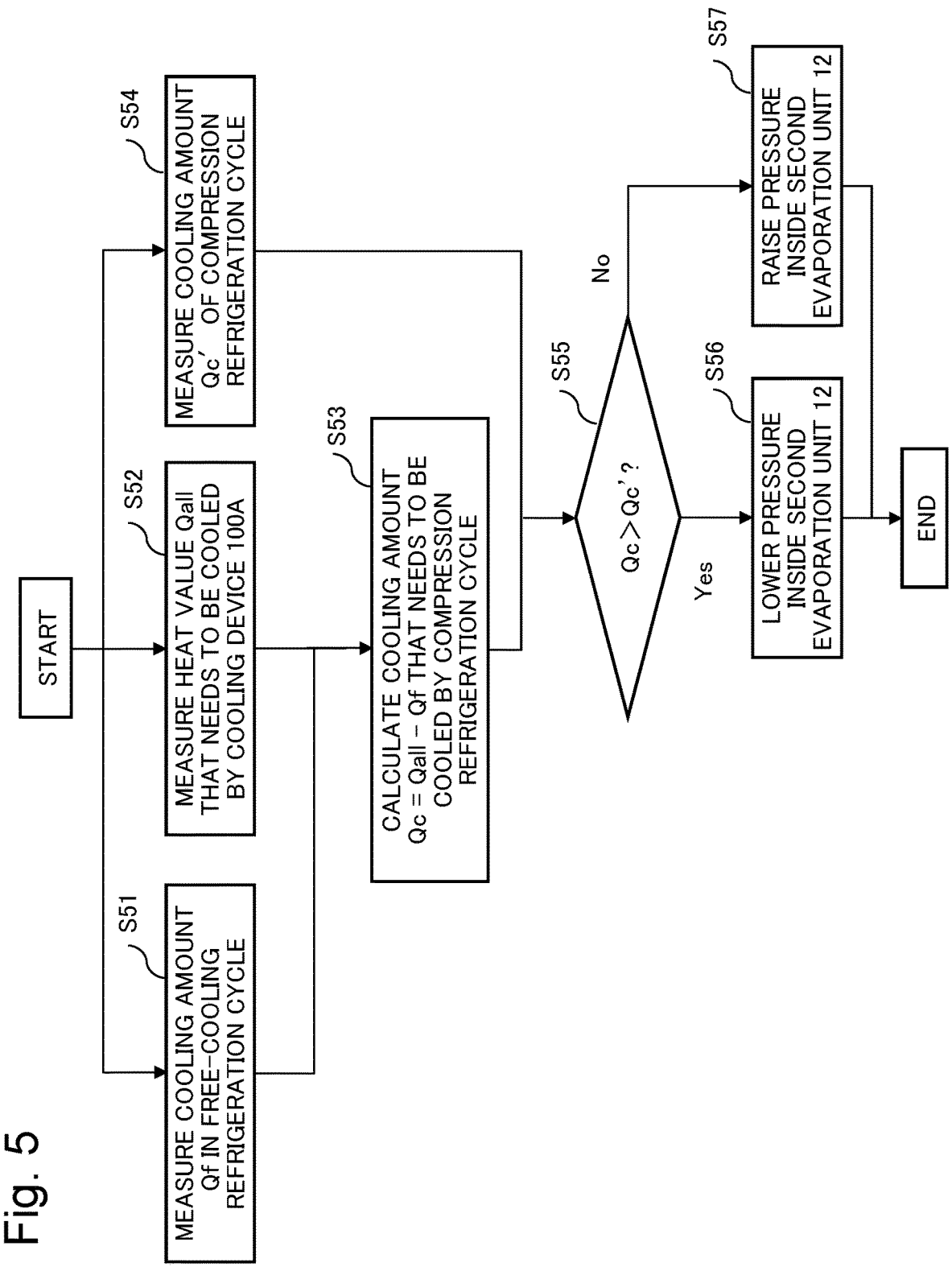
FIG. 5 is a flowchart for illustrating control of a compressor and an expansion valve.

FIG. 5 is a flowchart for illustrating the control of the compressor 30 and the expansion valve 40. FIG. 5 is basically similar to FIG. 2. Accordingly, overlapping description is partially omitted.

As illustrated in FIG. 5, first, the control unit 80 measures a cooling amount Qf in the free-cooling refrigeration cycle (S51). Qf is also referred to as a heat recovery amount by the free-cooling refrigeration cycle. At this time, a coolant thermometer (unillustrated) and a coolant flowmeter (unillustrated) for measuring temperature and a flow rate of a coolant COO are provided in the liquid pipe LP3-1 connecting between the first condensation unit 21 and the common pipe CP. The coolant thermometer (unillustrated) and the coolant flowmeter (unillustrated) provided in the liquid pipe LP3-1 measure temperature T7 and a flow rate w7 of a coolant COO flowing through the liquid pipe LP3-1, in accordance with an instruction provided by the control unit 80.

Denoting a cooling amount of a coolant COO per unit mass at the specific temperature T7 as ß (J/kg) and a flow rate of the coolant COO flowing through the liquid pipe LP1-1 as w7 (kg/s), the cooling amount Qf (W) in the free-cooling refrigeration cycle can be roughly estimated according to the following equation 9.

$$Qf \approx \beta \times w7 \quad \text{(equation 9)}$$

Note that ß is stored in a storage unit (unillustrated). Specifically, while ß varies with the temperature of the coolant COO, the storage unit stores data of ß for each temperature. The control unit 80 calculates Qf by multiplying ß stored in the storage unit by a measured value of w7, according to equation 9.

As another measurement method of Qf, the cooling amount Qf (W) in the free-cooling refrigeration cycle may be roughly estimated by use of equation 6, similarly to the first example embodiment.

Returning to FIG. 5, next, the control unit 80 measures a heat value Qall that needs to be cooled by the cooling device 100A (S52). Qall is also a heat value of the heat-generating body H. For example, when the heat-generating body H is a server device in a data center, Qall corresponds to power consumption of the server device. When a heat value flowing in from a wall surface of the data center can be measured, a value acquired by adding the heat value to the power consumption of the server device may be assumed as Qall.

Next, the control unit 80 measures a heat value Qc that needs to be cooled by the compression refrigeration cycle, in accordance with the following equation 10 (S53).

$$Qc = Qall - Qf \quad \text{(equation 10)}$$

Qc corresponds to a differential heat value being a heat value acquired by subtracting the cooling amount Qf by the free-cooling refrigeration cycle from the heat value Qall of the heat-generating body H.

Next, the control unit 80 measures a cooling amount Qc' of the compression refrigeration cycle (S54). A coolant thermometer (unillustrated) and a coolant flowmeter (unillustrated) for measuring temperature and a flow rate of a coolant COO are provided in the liquid pipe LP4-1 connecting between the second condensation unit 22 and the expansion valve 40. The coolant thermometer (unillustrated) and the coolant flowmeter (unillustrated) provided in the liquid pipe LP4-1 measure temperature T8 and a flow rate w8 of a coolant COO flowing through the liquid pipe LP4-1, in accordance with an instruction provided by the control unit 80.

Denoting a cooling amount of a coolant COO per unit mass at the specific temperature T8 as $\gamma$ (J/kg) and a flow rate of the coolant COO flowing through the liquid pipe LP4-1 as w8 (kg/s), the cooling amount Qc' (W) of the compression refrigeration cycle can be roughly estimated according to the following equation 11.

$$Qc' \approx \gamma \times w8 \quad \text{(equation 11)}$$

Note that $\gamma$ is stored in a storage unit (unillustrated) similarly to ß. Specifically, while $\gamma$ varies with the temperature of the coolant COO, the storage unit stores data of $\gamma$ for each temperature. The control unit 80 calculates Qc' by multiplying $\gamma$ stored in the storage unit by a measured value of w8, according to equation 11.

Next, the control unit 80 compares the heat value Qc that needs to be cooled by the compression refrigeration cycle with the current cooling amount Qc' of the compression refrigeration cycle (S55). When Qc is determined to be grater than Qc' by the control unit 80 as a result of the comparison (S55, Yes), the control unit 80 determines that Qc' is insufficient and performs control of lowering pressure P2 inside the second evaporation unit 12 (S56).

Specifically, the control unit 80 outputs, to the compressor 30, an instruction to raise a rotation rate of a motor in the compressor 30. Then, the compressor 30 raises the rotation rate of the motor in the compressor 30 in accordance with the instruction provided by the control unit 80. Consequently, an air intake of the compressor 30 increases, the pressure inside the vapor pipe VP2-1 decreases, and the pressure inside the second evaporation unit 12 connected to the vapor pipe VP2-1 also decreases.

The control unit 80 may output, to the expansion valve 40 instead of the compressor 30, an instruction to decrease a degree of opening of the expansion valve 40. Then, the expansion valve 40 decreases the degree of opening in accordance with the instruction provided by the control unit 80. Consequently, an amount of liquid-phase coolant LP-COO flowing into the second evaporation unit 12 decreases, and the pressure inside the second evaporation unit 12 connected to the vapor pipe VP2-1 also decreases.

Alternatively, the control unit 80 may simultaneously control both the compressor 30 and the expansion valve 40, as described above. Specifically, the control unit 80 outputs, to the compressor 30, an instruction to raise the rotation rate of the motor in the compressor 30 and also outputs, to the expansion valve 40, an instruction to decrease the degree of opening of the expansion valve 40. Then, the compressor 30 raises the rotation rate of the motor in the compressor 30 in accordance with the instruction provided by the control unit 80. Further, the expansion valve 40 decreases the degree of opening in accordance with the instruction provided by the control unit 80. Consequently, the pressure inside the second evaporation unit 12 connected to the vapor pipe VP2-1 can be decreased, similarly to the above.

When Qc is determined to be not greater than Qc' by the control unit 80 as a result of the comparison (S55, No), the control unit 80 determines that Qc' is in excess and performs control to raise the pressure P2 inside the second evaporation unit 12 (S57).

Specifically, the control unit 80 outputs, to the compressor 30, an instruction to lower the rotation rate of the motor in the compressor 30. Then, the compressor 30 lowers the rotation rate of the motor in the compressor 30 in accordance with the instruction provided by the control unit 80. Consequently, the air intake of the compressor 30 decreases, the pressure inside the vapor pipe VP2-1 increases, and the pressure inside the second evaporation unit 12 connected to the vapor pipe VP2-1 also increases.

The control unit 80 may output, to the expansion valve 40 instead of the compressor 30, an instruction to increase the degree of opening of the expansion valve 40. Then, the expansion valve 40 increases the degree of opening in accordance with the instruction provided by the control unit 80. Consequently, an amount of liquid-phase coolant LP-COO flowing into the second evaporation unit 12 increases, and the pressure inside the second evaporation unit 12 connected to the vapor pipe VP2-1 also increases.

Alternatively, the control unit 80 may simultaneously control both the compressor 30 and the expansion valve 40, as described above. Specifically, the control unit 80 outputs, to the compressor 30, an instruction to lower the rotation rate of the motor in the compressor 30 and also outputs, to the expansion valve 40, an instruction to increase the degree of opening of the expansion valve 40. Then, the compressor 30 lowers the rotation rate of the motor in the compressor 30 in accordance with the instruction provided by the control unit 80. Further, the expansion valve 40 increases the degree of opening in accordance with the instruction provided by the control unit 80. Consequently, the pressure inside the second evaporation unit 12 connected to the vapor pipe VP2-1 can be increased, similarly to the above.

The above concludes the description of the control of the compressor 30 and the expansion valve 40. As a modified example of the control of the compressor 30 and the expansion valve 40, the control illustrated in FIG. 3 may be performed, similarly to the first example embodiment.

As described above, the cooling device 100A according to the second example embodiment of the present invention includes the first evaporation unit 11, the second evaporation unit 12, the first condensation unit 21, the second condensation unit 22, the common pipe CP, the compressor 30, the expansion valve 40, the first valve 71, and the second valve. Each of the first evaporation unit 11 and the second evaporation unit 12 receives heat of the heat-generating body H, evaporates an internally stored liquid-phase coolant LP-COO by the heat of the heat-generating body H, and causes a gas-phase coolant GP-COO to flow out. The first condensation unit 21 is connected to the first evaporation unit 11. The first condensation unit 21 condenses a gas-phase coolant GP-COO flowing out from the first evaporation unit 11 and causes a liquid-phase coolant GP-COO to flow out. The second condensation unit 22 is connected to the second evaporation unit 12. The second condensation unit 22 condenses a gas-phase coolant GP-COO flowing out from the second evaporation unit 12 and causes a liquid-phase coolant LP-COO to flow out. The common pipe CP is provided between the first evaporation unit 11 and the first condensation unit 21 and also between the second evaporation unit 12 and the second condensation unit 22. The common pipe CP causes a liquid-phase coolant LP-COO flowing out from the first condensation unit 21 and a liquid-phase coolant LP-COO flowing out from the second condensation unit 22 to join. The compressor 30 is connected to the second evaporation unit 12 and the second condensation unit 22. The compressor 30 compresses a gas-phase coolant GP-COO flowing out from the second evaporation unit 12. The expansion valve 40 is connected to the second condensation unit 22 and the common pipe CP. The expansion valve 40 expands a liquid-phase coolant LP-COO flowing out from the second condensation unit 22. The first valve 71 is connected to the first evaporation unit 11 and the common pipe CP. The first valve 71 adjusts an amount of liquid-phase coolant LP-COO flowing into the first evaporation unit 11. The second valve 72 is connected to the second evaporation unit 12 and the common pipe CP. The second valve 72 adjusts an amount of liquid-phase coolant LP-COO flowing into the second evaporation unit 12. The pressure P0 inside the common pipe CP is greater than the pressure P1 inside the first evaporation unit 11 and the pressure P2 inside the second evaporation unit 12.

Thus, by providing the common pipe CP, the cooling device 100A causes a liquid-phase coolant LP-COO flowing out from the first condensation unit 21 and a liquid-phase coolant LP-COO flowing out from the second condensation unit 22 to join. Consequently, compared with the cooling device described in PTL 1, the cooling device 100A can shorten a piping length of liquid pipes in particular. Consequently, the cooling device 100A can reduce a piping cost and a pipe installation cost compared with the cooling device described in PTL 1.

A part or the whole of the aforementioned first and second example embodiments may also be described as the following Supplementary Notes but are not limited thereto.

Supplementary Note 1

A cooling device including:

a first evaporation unit and a second evaporation unit each of which receiving heat of a heat-generating body, evaporating an internally stored liquid-phase coolant by heat of the heat-generating body, and causing a gas-phase coolant to flow out;

a first condensation unit being connected to the first evaporation unit, condensing a gas-phase coolant flowing out from the first evaporation unit, and causing a liquid-phase coolant to flow out;

a second condensation unit being connected to the second evaporation unit, condensing a gas-phase coolant flowing out from the second evaporation unit, and causing a liquid-phase coolant to flow out;

a common pipe being provided between the first evaporation unit and the first condensation unit and also between the second evaporation unit and the second condensation unit and causing a liquid-phase coolant flowing out from the first condensation unit and a liquid-phase coolant flowing out from the second condensation unit to join;

a compressor being connected to the second evaporation unit and the second condensation unit and compressing a gas-phase coolant flowing out from the second evaporation unit;

an expansion valve being connected to the second condensation unit and the common pipe and expanding a liquid-phase coolant flowing out from the second condensation unit;

a first valve being connected to the first evaporation unit and the common pipe and adjusting an amount of liquid-phase coolant flowing into the first evaporation unit; and a second valve being connected to the second evaporation unit and the common pipe and adjusting an amount of liquid-phase coolant flowing into the second evaporation unit, wherein pressure inside the common pipe is greater than pressure inside the first evaporation unit and pressure inside the second evaporation unit.

Supplementary Note 2

The cooling device according to Supplementary Note 1, wherein the first condensation unit and the second condensation unit are provided on an upper side of the first evaporation unit and the second evaporation unit in a vertical direction and also at positions making pressure inside the common pipe greater than pressure inside the first evaporation unit and pressure inside the second evaporation unit.

Supplementary Note 3

The cooling device according to Supplementary Note 1 or 2, further including:

a first pump being provided between the first condensation unit and the common pipe and conveying a liquid-phase coolant flowing out from the first condensation unit to the common pipe in such a way that pressure inside the common pipe is greater than pressure inside the first evaporation unit and pressure inside the second evaporation unit; and a second pump being provided between the second condensation unit and the common pipe and conveying a liquid-phase coolant flowing out from the second condensation unit in such a way that pressure inside the common pipe is greater than pressure inside the first evaporation unit and pressure inside the second evaporation unit.

Supplementary Note 4

The cooling device according to Supplementary Note 3, further including a first tank being provided between the first condensation unit and the common pipe and also on an upper side of the first pump in a vertical direction and storing a liquid-phase coolant caused to flow out by the first condensation unit.

Supplementary Note 5

The cooling device according to Supplementary Note 4, wherein the first pump conveys, to the common pipe, a liquid-phase coolant flowing out from the first condensation unit, according to a surface level of a liquid-phase coolant in the first tank.

Supplementary Note 6

The cooling device according to any one of Supplementary Notes 3 to 5, further including a second tank being provided between the second condensation unit and the common pipe and also on an upper side of the second pump in a vertical direction and storing a liquid-phase coolant caused to flow out by the second condensation unit.

Supplementary Note 7

The cooling device according to Supplementary Note 6, wherein the second pump conveys a liquid-phase coolant flowing out from the second condensation unit to the common pipe, according to a surface level of a liquid-phase coolant in the second tank.

Supplementary Note 8

The cooling device according to Supplementary Note 6 or 7, further including a bypass pipe guiding a gas-phase coolant contained in the second tank to the compressor.

Supplementary Note 9

The cooling device according to any one of Supplementary Notes 1 to 8, further including a control unit configuring:

a free-cooling refrigeration cycle circulating a liquid-phase or gas-phase coolant among the first evaporation unit, the first condensation unit, and the common pipe; and a compression refrigeration cycle circulating a liquid-phase or gas-phase coolant among the second evaporation unit, the second condensation unit, the compressor, the expansion valve, and the common pipe, and controlling either one or both of the compressor and the expansion valve, based on a differential heat value being a heat value acquired by subtracting a heat recovery amount by the free-cooling refrigeration cycle from a heat value of the heat-generating body.

Supplementary Note 10

The cooling device according to any one of Supplementary Notes 1 to 8, further including a control unit controlling either one or both of the compressor and the expansion valve, based on temperature around a heat-generating body.

Supplementary Note 11

The cooling device according to any one of Supplementary Notes 1 to 10, wherein the first valve adjusts an amount of liquid-phase coolant flowing into the first evaporation unit, based on a heat recovery amount of the first evaporation unit, and the second valve adjusts an amount of liquid-phase coolant flowing into the second evaporation unit, based on a heat recovery amount of the second evaporation unit.

Supplementary Note 12

The cooling device according to Supplementary Note 11, further including:

a first vapor pipe for connecting the first evaporation unit and the first condensation unit and causing a gas-phase coolant to flow from the first evaporation unit to the first condensation unit; and a second vapor pipe for connecting the second evaporation unit and the second condensation unit and causing a gas-phase coolant to flow from the second evaporation unit to the second condensation unit, wherein the first valve adjusts an amount of liquid-phase coolant flowing into the first evaporation unit, based on temperature of the first vapor pipe instead of a heat recovery amount of the first evaporation unit, and the second valve adjusts an amount of liquid-phase coolant flowing into the second evaporation unit, based on temperature of the second vapor pipe instead of a heat recovery amount of the second evaporation unit.

Supplementary Note 13

A control method for a cooling device including:

a first evaporation unit and a second evaporation unit each of which receiving heat of a heat-generating body, evaporating an internally stored liquid-phase coolant by heat of the heat-generating body, and causing a gas-phase coolant to flow out;

a first condensation unit being connected to the first evaporation unit, condensing a gas-phase coolant flowing out from the first evaporation unit, and causing a liquid-phase coolant to flow out;

a second condensation unit being connected to the second evaporation unit, condensing a gas-phase coolant flowing out from the second evaporation unit, and causing a liquid-phase coolant to flow out;

a common pipe being provided between the first evaporation unit and the first condensation unit and also between the second evaporation unit and the second condensation unit and causing a liquid-phase coolant flowing out from the first condensation unit and a liquid-phase coolant flowing out from the second condensation unit to join;

a compressor being connected to the second evaporation unit and the second condensation unit and compressing a gas-phase coolant flowing out from the second evaporation unit;

an expansion valve being connected to the second condensation unit and the common pipe and expanding a liquid-phase coolant flowing out from the second condensation unit;

a first valve being connected to the first evaporation unit and the common pipe and adjusting an amount of liquid-phase coolant flowing into the first evaporation unit; and a second valve being connected to the second evaporation unit and the common pipe and adjusting an amount of liquid-phase coolant flowing into the second evaporation unit, the control method including control processing of configuring:

a free-cooling refrigeration cycle circulating a liquid-phase or gas-phase coolant among the first evaporation unit, the first condensation unit, and the common pipe; and a compression refrigeration cycle circulating a liquid-phase or gas-phase coolant among the second evaporation unit, the second condensation unit, the compressor, the expansion valve, and the common pipe, and controlling either one or both of the compressor and the expansion valve, based on a differential heat value being a heat value acquired by subtracting a heat recovery amount by the free-cooling refrigeration cycle from a heat value of the heat-generating body, wherein pressure inside the common pipe is greater than pressure inside the first evaporation unit and pressure inside the second evaporation unit.

Supplementary Note 14

A control program for a cooling device including:

a first evaporation unit and a second evaporation unit each of which receiving heat of a heat-generating body, evaporating an internally stored liquid-phase coolant by heat of the heat-generating body, and causing a gas-phase coolant to flow out;

a first condensation unit being connected to the first evaporation unit, condensing a gas-phase coolant flowing out from the first evaporation unit, and causing a liquid-phase coolant to flow out;

a second condensation unit being connected to the second evaporation unit, condensing a gas-phase coolant flowing out from the second evaporation unit, and causing a liquid-phase coolant to flow out;

a common pipe being provided between the first evaporation unit and the first condensation unit and also between the second evaporation unit and the second condensation unit and causing a liquid-phase coolant flowing out from the first condensation unit and a liquid-phase coolant flowing out from the second condensation unit to join;

a compressor being connected to the second evaporation unit and the second condensation unit and compressing a gas-phase coolant flowing out from the second evaporation unit;

an expansion valve being connected to the second condensation unit and the common pipe and expanding a liquid-phase coolant flowing out from the second condensation unit;

a first valve being connected to the first evaporation unit and the common pipe and adjusting an amount of liquid-phase coolant flowing into the first evaporation unit; and a second valve being connected to the second evaporation unit and the common pipe and adjusting an amount of liquid-phase coolant flowing into the second evaporation unit, the control program causing a computer to execute control processing of configuring:
a free-cooling refrigeration cycle circulating a liquid-phase or gas-phase coolant among the first evaporation unit, the first condensation unit, and the common pipe; and
a compression refrigeration cycle circulating a liquid-phase or gas-phase coolant among the second evaporation unit, the second condensation unit, the compressor, the expansion valve, and the common pipe, and controlling either one or both of the compressor and the expansion valve, based on a differential heat value being a heat value acquired by subtracting a heat recovery amount by the free-cooling refrigeration cycle from a heat value of the heat-generating body, wherein pressure inside the common pipe is greater than pressure inside the first evaporation unit and pressure inside the second evaporation unit.

Supplementary Note 15

A storage medium storing a control program for a cooling device including:

a first evaporation unit and a second evaporation unit each of which receiving heat of a heat-generating body, evaporating an internally stored liquid-phase coolant by heat of the heat-generating body, and causing a gas-phase coolant to flow out;

a first condensation unit being connected to the first evaporation unit, condensing a gas-phase coolant flowing out from the first evaporation unit, and causing a liquid-phase coolant to flow out;

a second condensation unit being connected to the second evaporation unit, condensing a gas-phase coolant flowing out from the second evaporation unit, and causing a liquid-phase coolant to flow out;

a common pipe being provided between the first evaporation unit and the first condensation unit and also between the second evaporation unit and the second condensation unit and causing a liquid-phase coolant flowing out from the first condensation unit and a liquid-phase coolant flowing out from the second condensation unit to join;

a compressor being connected to the second evaporation unit and the second condensation unit and compressing a gas-phase coolant flowing out from the second evaporation unit;

an expansion valve being connected to the second evaporation unit and the common pipe and expanding a liquid-phase coolant flowing out from the second condensation unit;

a first valve being connected to the first evaporation unit and the common pipe and adjusting an amount of liquid-phase coolant flowing into the first evaporation unit; and a second valve being connected to the second evaporation unit and the common pipe and adjusting an amount of liquid-phase coolant flowing into the second evaporation unit, the control program causing a computer to execute control processing of configuring:
a free-cooling refrigeration cycle circulating a liquid-phase or gas-phase coolant among the first evaporation unit, the first condensation unit, and the common pipe; and
a compression refrigeration cycle circulating a liquid-phase or gas-phase coolant among the second evaporation unit, the second condensation unit, the compressor, the expansion valve, and the common pipe, and controlling either one or both of the compressor and the expansion valve, based on a differential heat value being a heat value acquired by subtracting a heat recovery amount by the free-cooling refrigeration cycle from a heat value of the heat-generating body, wherein pressure inside the common pipe is greater than pressure inside the first evaporation unit and pressure inside the second evaporation unit.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2018-055825, filed on Mar. 23, 2018, the disclosure of which is incorporated herein in its entirety by reference.

REFERENCE SIGNS LIST 100, 100A Cooling device
11 First evaporation unit
12 Second evaporation unit
21 First condensation unit
22 Second condensation unit
30 Compressor
40 Expansion valve
51 First tank
52 Second tank
61 First pump
62 Second pump
71 First valve
72 Second valve
80 Control unit
CP Common pipe
VP1 First vapor pipe
VP2-1, VP2-2 Second vapor pipe
LP1-1, LP1-2, LP1-3, LP1-4, LP1-5 First liquid pipe
LP3-1, LP3-2, LP3-3 First liquid pipe
LP2-1, LP2-2, LP2-3 Second liquid pipe
LP2-4, LP2-5, LP2-6 Second liquid pipe
LP4-1, LP4-2, LP4-3, LP4-4 Second liquid pipe

What is claimed is:

1. A cooling device comprising:
   a first evaporator receiving heat of a heat generator, evaporating an internally stored liquid-phase coolant by heat of the heat generator, and causing a gas-phase coolant to flow out;
   a second evaporator receiving heat of the heat-generator, evaporating an internally stored liquid-phase coolant by heat of the heat-generator, and causing a gas-phase coolant to flow out;
   a first condenser being connected to the first evaporator, condensing a gas-phase coolant flowing out from the first evaporator, and causing a liquid-phase coolant to flow out;
   a second condenser being connected to the second evaporator, condensing a gas-phase coolant flowing out from the second evaporator, and causing a liquid-phase coolant to flow out;
   a common pipe being provided between the first evaporator and the first condenser and also between the second evaporator and the second condenser and causing a liquid-phase coolant flowing out from the first condenser and a liquid-phase coolant flowing out from the second condenser to join;
   a compressor being connected to the second evaporator and the second condenser and compressing a gas-phase coolant flowing out from the second evaporator;
   an expansion valve being connected to the second condenser and the common pipe and expanding a liquid-phase coolant flowing out from the second condenser;
   a first valve being connected to the first evaporator and the common pipe and adjusting an amount of liquid-phase coolant flowing into the first evaporator; and
   a second valve being connected to the second evaporator and the common pipe and adjusting an amount of liquid-phase coolant flowing into the second evaporator, wherein
   pressure inside the common pipe is greater than pressure inside the first evaporator and pressure inside the second evaporator.

2. The cooling device according to claim 1, wherein
   the first condenser and the second condenser are provided on an upper side of the first evaporator and the second evaporator in a vertical direction and also at positions making pressure inside the common pipe greater than pressure inside the first evaporator and pressure inside the second evaporator.

3. The cooling device according to claim 2, further comprising:
   a first pump being provided between the first condenser and the common pipe and conveying a liquid-phase coolant flowing out from the first condenser to the common pipe in such a way that pressure inside the common pipe is greater than pressure inside the first evaporator and pressure inside the second evaporator; and
   a second pump being provided between the second condenser and the common pipe and conveying a liquid-phase coolant flowing out from the second condenser in such a way that pressure inside the common pipe is greater than pressure inside the first evaporator and pressure inside the second evaporator.

4. The cooling device according to claim 1, further comprising:
   a first pump being provided between the first condenser and the common pipe and conveying a liquid-phase coolant flowing out from the first condenser to the common pipe in such a way that pressure inside the common pipe is greater than pressure inside the first evaporator and pressure inside the second evaporator; and
   a second pump being provided between the second condenser and the common pipe and conveying a liquid-phase coolant flowing out from the second condenser in such a way that pressure inside the common pipe is greater than pressure inside the first evaporator and pressure inside the second evaporator.

5. The cooling device according to claim 4, further comprising
   a first tank being provided between the first condenser and the common pipe and also on an upper side of the first pump in a vertical direction and storing a liquid-phase coolant caused to flow out by the first condenser.

6. The cooling device according to claim 5, wherein
   the first pump conveys, to the common pipe, a liquid-phase coolant flowing out from the first condenser, according to a surface level of a liquid-phase coolant in the first tank.

7. The cooling device according to claim 4, further comprising
   a second tank being provided between the second condenser and the common pipe and also on an upper side of the second pump in a vertical direction and storing a liquid-phase coolant caused to flow out by the second condenser.

8. The cooling device according to claim 7, wherein
   the second pump conveys a liquid-phase coolant flowing out from the second condenser to the common pipe, according to a surface level of a liquid-phase coolant in the second tank.

9. The cooling device according to claim 7, further comprising
   a bypass pipe guiding a gas-phase coolant contained in the second tank to the compressor.

10. The cooling device according to claim 1, further comprising
    a controller configuring:
      a free-cooling refrigeration cycle circulating a liquid-phase or gas-phase coolant among the first evaporator, the first condenser, and the common pipe; and
      a compression refrigeration cycle circulating a liquid-phase or gas-phase coolant among the second evaporator, the second condenser, the compressor, the expansion valve, and the common pipe, and
    controlling either one or both of the compressor and the expansion valve, based on a differential heat value being a heat value acquired by subtracting a heat recovery amount by the free-cooling refrigeration cycle from a heat value of the heat generator.

11. The cooling device according to claim 1, further comprising
    a controller controlling either one or both of the compressor and the expansion valve, based on temperature around heat generator.

12. The cooling device according to claim 1, wherein
    the first valve adjusts an amount of liquid-phase coolant flowing into the first evaporator, based on a heat recovery amount of the first evaporator, and
    the second valve adjusts an amount of liquid-phase coolant flowing into the second evaporator, based on a heat recovery amount of the second evaporator.

13. A control method for a cooling device including:
a first evaporator receiving heat of a heat generator, evaporating an internally stored liquid-phase coolant by heat of the heat generator, and causing a gas-phase coolant to flow out;
a second evaporator receiving heat of the heat-generator, evaporating an internally stored liquid-phase coolant by heat of the heat-generator, and causing a gas-phase coolant to flow out;
a first condenser being connected to the first evaporator, condensing a gas-phase coolant flowing out from the first evaporator, and causing a liquid-phase coolant to flow out;
a second condenser being connected to the second evaporator, condensing a gas-phase coolant flowing out from the second evaporator, and causing a liquid-phase coolant to flow out;
a common pipe being provided between the first evaporator and the first condenser and also between the second evaporator and the second condenser and causing a liquid-phase coolant flowing out from the first condenser and a liquid-phase coolant flowing out from the second condenser to join;
a compressor being connected to the second evaporator and the second condenser and compressing a gas-phase coolant flowing out from the second evaporator;
an expansion valve being connected to the second condenser and the common pipe and expanding a liquid-phase coolant flowing out from the second condenser;
a first valve being connected to the first evaporator and the common pipe and adjusting an amount of liquid-phase coolant flowing into the first evaporator; and
a second valve being connected to the second evaporator and the common pipe and adjusting an amount of liquid-phase coolant flowing into the second evaporator, the control method comprising control processing of configuring:
a free-cooling refrigeration cycle circulating a liquid-phase or gas-phase coolant among the first evaporator, the first condenser, and the common pipe; and
a compression refrigeration cycle circulating a liquid-phase or gas-phase coolant among the second evaporator, the second condenser, the compressor, the expansion valve, and the common pipe, and
controlling either one or both of the compressor and the expansion valve, based on a differential heat value being a heat value acquired by subtracting a heat recovery amount by the free-cooling refrigeration cycle from a heat value of the heat generator, wherein
pressure inside the common pipe is greater than pressure inside the first evaporator and pressure inside the second evaporator.

14. A non-transitory computer readable medium storing a control program for a cooling device including:
a first evaporator receiving heat of a heat generator, evaporating an internally stored liquid-phase coolant by heat of the heat generator, and causing a gas-phase coolant to flow out;
a second evaporator receiving heat of the heat-generator, evaporating an internally stored liquid-phase coolant by heat of the heat-generator, and causing a gas-phase coolant to flow out;
a first condenser being connected to the first evaporator, condensing a gas-phase coolant flowing out from the first evaporator, and causing a liquid-phase coolant to flow out;
a second condenser being connected to the second evaporator, condensing a gas-phase coolant flowing out from the second evaporator, and causing a liquid-phase coolant to flow out;
a common pipe being provided between the first evaporator and the first condenser and also between the second evaporator and the second condenser and causing a liquid-phase coolant flowing out from the first condenser and a liquid-phase coolant flowing out from the second condenser to join;
a compressor being connected to the second evaporator and the second condenser and compressing a gas-phase coolant flowing out from the second evaporator;
an expansion valve being connected to the second condenser and the common pipe and expanding a liquid-phase coolant flowing out from the second condenser;
a first valve being connected to the first evaporator and the common pipe and adjusting an amount of liquid-phase coolant flowing into the first evaporator; and
a second valve being connected to the second evaporator and the common pipe and adjusting an amount of liquid-phase coolant flowing into the second evaporator, the control program causing a computer to execute control processing of configuring:
a free-cooling refrigeration cycle circulating a liquid-phase or gas-phase coolant among the first evaporator, the first condenser, and the common pipe; and
a compression refrigeration cycle circulating a liquid-phase or gas-phase coolant among the second evaporator, the second condenser, the compressor, the expansion valve, and the common pipe, and
controlling either one or both of the compressor and the expansion valve, based on a differential heat value being a heat value acquired by subtracting a heat recovery amount by the free-cooling refrigeration cycle from a heat value of the body heat generator, wherein
pressure inside the common pipe is greater than pressure inside the first evaporator and pressure inside the second evaporator.

* * * * *